(12) United States Patent
O'Sullivan et al.

(10) Patent No.: US 9,111,947 B2
(45) Date of Patent: Aug. 18, 2015

(54) CHIP ARRANGEMENT WITH A RECESSED CHIP HOUSING REGION AND A METHOD FOR MANUFACTURING THE SAME

(71) Applicant: Intel Mobile Communications GmbH, Neubiberg (DE)

(72) Inventors: David O'Sullivan, Sinzing (DE); Thorsten Meyer, Regensburg (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 17 days.

(21) Appl. No.: 13/909,158

(22) Filed: Jun. 4, 2013

(65) Prior Publication Data
US 2014/0353836 A1    Dec. 4, 2014

(51) Int. Cl.
| | |
|---|---|
| H01L 23/48 | (2006.01) |
| H01L 23/52 | (2006.01) |
| H01L 29/40 | (2006.01) |
| H01L 23/28 | (2006.01) |
| H01L 23/04 | (2006.01) |
| H01L 21/56 | (2006.01) |
| H01L 23/31 | (2006.01) |

(52) U.S. Cl.
CPC ............ *H01L 21/56* (2013.01); *H01L 23/3157* (2013.01)

(58) Field of Classification Search
USPC ......... 257/773, 787, 730, 731, 733, 778, 782, 257/783, 786
See application file for complete search history.

(56) References Cited

U.S. PATENT DOCUMENTS

| | | | | |
|---|---|---|---|---|
| 5,739,585 | A * | 4/1998 | Akram et al. ................. | 257/698 |
| 7,288,835 | B2 * | 10/2007 | Yim et al. ..................... | 257/685 |
| 2013/0134573 | A1 | 5/2013 | Meyer | |

* cited by examiner

*Primary Examiner* — A. Sefer
*Assistant Examiner* — Dilinh Nguyen

(57) ABSTRACT

A chip arrangement may include: a semiconductor chip; an encapsulating structure at least partially encapsulating the semiconductor chip, the encapsulating structure having a first side and a second side opposite the first side, the encapsulating structure including a recess over the first side of the encapsulating structure, the recess having a bottom surface located at a first level; and at least one electrical connector disposed at the first side of the encapsulating structure outside the recess, wherein a surface of the at least one electrical connector facing the encapsulating structure may be disposed at a second level different from the first level.

17 Claims, 13 Drawing Sheets

CHIP ARRANGEMENT WITH A RECESSED CHIP HOUSING REGION AND A METHOD FOR MANUFACTURING THE SAME

TECHNICAL FIELD

Various aspects relate to chip arrangements and a method for manufacturing a chip arrangement.

BACKGROUND

A semiconductor chip (or die) may be packaged prior to distribution. Packaging a semiconductor chip (or die) may include encapsulating the semiconductor chip in a material, and may further include providing an interface (e.g. an electrical interface) to the encapsulated semiconductor chip (which may also be referred to as a semiconductor chip package).

As the demand for functional integration of semiconductor chip packages grows, the semiconductor chip package may be integrated with at least one electronic device (e.g. a surface-mount device (SMD) component, microelectromechanical systems device, passive device, active device, etc.). The integration of the at least one electronic device and the semiconductor chip package may include forming an electrical connection between the at least one electronic device (e.g. SMD component) and the semiconductor chip package.

Minimizing a length of the electrical connection between the at least one electronic device and the semiconductor chip package may provide a reliable electrical connection that may have good electrical performance (e.g. lower resistance and/or capacity and/or inductivity). Whilst such characteristics of the electrical connection between the at least one electronic device and the semiconductor chip package may be desirable, a size (e.g. a height and/or a thickness) of the at least one electronic device may prevent the shortest possible electrical connection between the at least one electronic device and the semiconductor chip package from being formed. Accordingly, new ways of integrating a semiconductor chip package with an electronic device may be needed.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
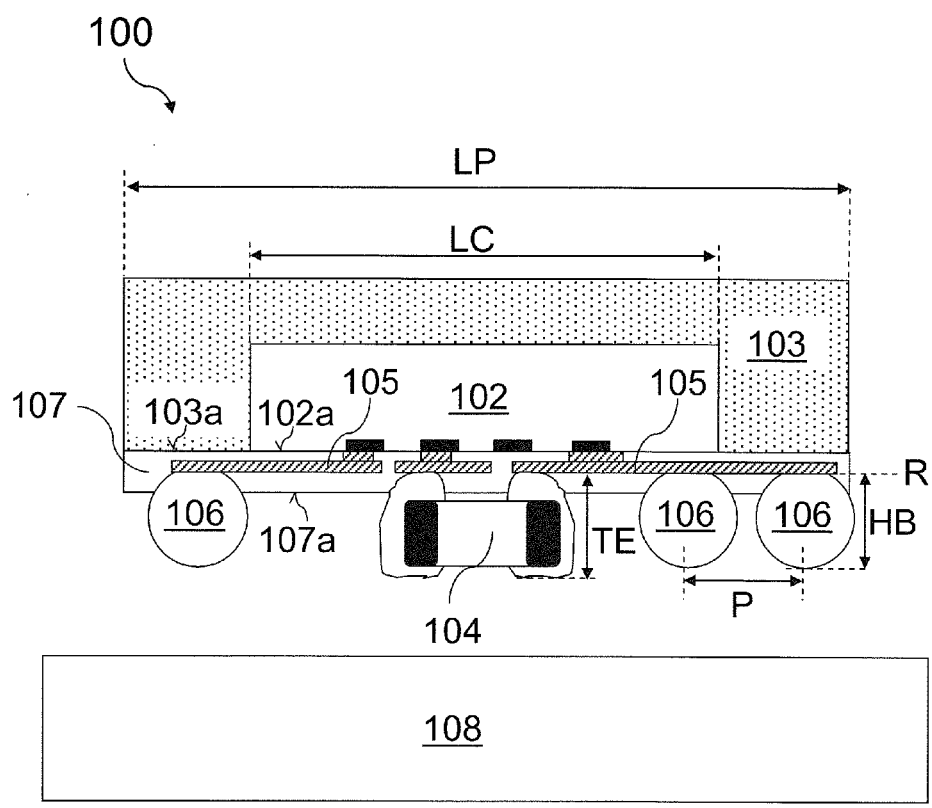
FIG. 1A shows a chip arrangement including a semiconductor chip at least partially encapsulated in a mold compound, and arranged in a face-to-face arrangement with an electronic device.

The following detailed description refers to the accompanying drawings that show, by way of illustration, specific details and aspects in which the invention may be practised. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described for structures or devices, and various aspects are described for methods. It may be understood that one or more (e.g. all) aspects described in connection with structures or devices may be equally applicable to the methods, and vice versa.

The word "exemplary" is used herein to mean "serving as an example, instance, or illustration". Any aspect or design described herein as "exemplary" is not necessarily to be construed as preferred or advantageous over other aspects or designs.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupled" and/or "electrically coupled" and/or "connected" and/or "electrically connected", used herein to describe a feature being connected to at least one other implied feature, are not meant to mean that the feature and the at least one other implied feature must be directly coupled or connected together; intervening features may be provided between the feature and at least one other implied feature.

Directional terminology, such as e.g. "below", "above", "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

As the demand for functional integration of semiconductor chip packages grows, a semiconductor chip package may be integrated with at least one electronic device (e.g. a surface-mount device (SMD) component, microelectromechanical systems device, passive device, active device, etc.). An example of such an integration may be a DC-to-DC converter (direct current-to-direct current converter). The integration of the at least one electronic device and the semiconductor chip package may include forming an electrical connection between the at least one electronic device and the semiconductor chip package.

An effective way to achieve good electrical performance when integrating the semiconductor chip package and with at least one electronic device may be to minimize a distance of the electrical connection between the at least one electronic device and the semiconductor chip package. This may, for example, require a face-to-face placement (or face-to-face arrangement) of the at least one electronic device and the semiconductor chip package. A face-to-face arrangement may refer to an arrangement in which an active side of the at least one electronic device may face an active side of the encapsulated semiconductor chip of the semiconductor chip package.

Although electronic devices with small form factors (e.g. size, e.g. dimensions, e.g. thickness, length, width) may be available, a limiting factor for placing the at least one electronic device in a face-to-face arrangement with the encapsulated semiconductor chip may be a thickness and/or a height of the at least one electronic device.

FIG. 1A shows a chip arrangement 100 including a semiconductor chip 102 at least partially encapsulated in a mold compound 103, and arranged in a face-to-face arrangement with an electronic device 104.

As shown in FIG. 1A, the semiconductor chip 102 may be at least partially encapsulated in the mold compound 103. The semiconductor chip 102 may be electrically connected to a redistribution structure 105 (e.g. a redistribution layer) which may be at least partially disposed within an insulating layer 107 (e.g. including a dielectric layer and/or a solder stop layer). The chip arrangement 100 may be configured as a fan-out wafer level package. In other words, a lateral extent LP of the mold compound 103 may be greater than a lateral extent LC of the semiconductor chip 102. An example of a fan-out wafer level package may include an embedded wafer level ball grid array (eWLB). The arrangement of the semiconductor chip 102 at least partially encapsulated in the mold compound 103 and electrically connected to the redistribution structure 105 at least partially disposed in the insulating layer 107 may be formed by means of a fan-out wafer level package process (e.g. an eWLB process flow, e.g. a standard eWLB process flow).

The face-to-face arrangement of the electronic device 104 and the semiconductor chip 102 may minimize a length of the electrical connection between the electronic device 104 and the encapsulated semiconductor chip 102, and this may lead to high reliability of the electrical connection. For example, the electrical connection may have good electrical performance (e.g. lower resistance and/or capacity and/or inductivity).

A thickness TE of the electronic device 104 may be measured from a reference line R, which in the example shown in FIG. 1A may be measured from the redistribution structure 105. In another example, another reference line R may be selected to measure the thickness TE of the electronic device 104. For example, the thickness TE may be measured from a side 107a of the insulating layer 107 facing away from the semiconductor chip 102.

The thickness TE of the electronic device 104 may be in the range from about 200 µm to about 650 µm. For example, the electronic device 104 may include, or may be, a surface-mount device (SMD) component, such as, for example, a passive SMD component (e.g. resistor and/or capacitor and/or inductor). In such an example, an 0402 SMD component may have a thickness TE in the range from about 300 µm to about 600 µm. By way of another example, an 0201 SMD component may have a thickness TE in the range from about 250 µm to about 400 µm.

As shown in FIG. 1A, the chip arrangement 100 may include a plurality of solder balls 106. The plurality of solder balls 106 may provide an interface (e.g. an electrical interface) for the semiconductor chip 102. In other words, signals (e.g. electrical signals, power supply potentials, ground potentials, etc.) may be exchanged with the semiconductor chip 102 via the plurality of solder balls 106 and the redistribution structure 105.

A height HB of the plurality of solder balls 106 may be measured from the same reference line R used to measure the thickness TE of the electronic device 104. In the example shown in FIG. 1A, the height HB may be measured from the redistribution structure 105. In another example, another reference line R may be selected to measure the height HB of the plurality of solder balls 106. For example, the height HB may be measured from a side 107a of the insulating layer 107 facing away from the semiconductor chip 102.

The height HB of the plurality of solder balls 106 may depend on a pitch P of the plurality of solder balls 106 (i.e. a distance between adjacent solder balls of the plurality of solder balls 106). For example, a pitch P of 0.4 mm may lead to a height HB in the range from about 180 µm to about 250 µm. By way of another example, a pitch P of 0.5 mm may lead to a height HB in the range from about 200 µm to about 300 µm. The aforementioned examples are merely illustrative, and are not meant to be limiting.

In an example where the chip arrangement 100 may be electrically connected to a circuit board 108 (e.g. a printed circuit board, e.g. for mobile communications applications) by means of the plurality of solder balls 106, a comparison of the thickness TE of the electronic device 104 and a height HB of the plurality of solder balls 106 may indicate that the thickness TE of the electronic device 104 may be too large to allow it to be placed between the encapsulated semiconductor chip 102 and the circuit board 108. Stated in another way, the thickness TE of the electronic device 104 may be too large to allow it to be placed laterally adjacent to and between the plurality of solder balls 106. Accordingly, a face-to-face arrangement of the electronic device 104 and the encapsulated semiconductor chip 102 may not be possible, e.g. in eWLB packages. A similar observation may be made in examples where the electronic device 104 (e.g. SMD component) may be replaced by a second semiconductor chip, which may be configured as a daughter die to the encapsulated semiconductor chip 102, which may be configured as a mother die.

A possible reason for this may be that in a standard process flow for eWLB manufacturing, the semiconductor chip 102 may be placed on a carrier (e.g. a metal substrate, e.g. a foil covered metal substrate) prior to at least partially encapsulating the semiconductor chip 102 in the mold compound 103. The carrier (e.g. a metal substrate) may be at least substantially flat. In other words, the carrier (e.g. metal substrate) may be at least substantially planar. Subsequently, a surface of a material (e.g. a foil) that may be disposed over (e.g. deposited over) the carrier (e.g. metal substrate) may be at least substantially planar (e.g. at least substantially flat) as well, and may, for example, be parallel to a surface of the carrier (e.g. metal substrate).

A plurality of semiconductor chips 102 may be arranged as a matrix over the carrier (e.g. metal substrate, e.g. a foil covered metal substrate). A size of the matrix of semiconductor chips 102 may depend on a size of the mold tool used and/or the required size of an individual chip package. At least partially encapsulating the matrix of semiconductor chips 102 may provide a reconstituted wafer in which a side 103a of the mold compound 103 and a side 102a of the semiconductor chip 102 may be on the same plane. In other words, the side 103a of the mold compound 103 and the side 102a of the semiconductor chip 102 may be co-planar (e.g. form an at least substantially flat or at least substantially planar surface). Accordingly, the thickness TE of the electronic device 104 placed on the side 103a of the mold compound 103 and/or the side 102a of the semiconductor chip 102 may exceed the height HB of the plurality of solder balls 106 disposed over the side 103a of the mold compound 103 and/or the side 102a of the semiconductor chip 102.

A way to circumvent this problem may be to embed the semiconductor chip 102 in a substrate and to dispose the electronic device 104 over the substrate.

Figure 1B:
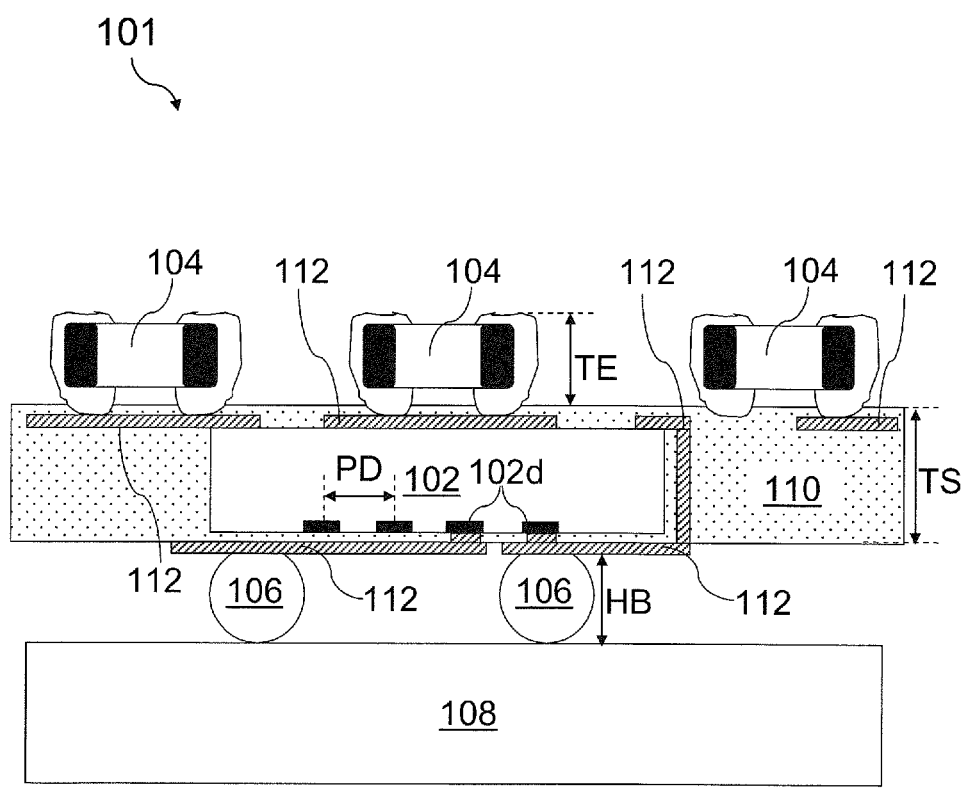
FIG. 1B shows a chip arrangement including a semiconductor chip embedded in a substrate, and a plurality of electronic devices disposed over the substrate.

FIG. 1B shows a chip arrangement 101 including the semiconductor chip 102 embedded in a substrate 110, and a plurality of electronic devices 104 disposed over the substrate 110.

Reference signs in FIG. 1B that are the same as in FIG. 1A denote the same or similar elements as in FIG. 1A. Thus, those elements will not be described in detail again here; reference is made to the description above. Differences between FIG. 1B and FIG. 1A are described below.

The substrate 110 may include, or may be, a laminate substrate. For example, the substrate 110 may include, or may be, a printed circuit board.

Since the semiconductor chip 102 may be embedded in the substrate 110 (e.g. laminate substrate), the plurality of electronic devices 104 (e.g. SMD components, e.g. passive SMD components) may be disposed over (e.g. mounted on top of) the substrate 110 (e.g. over the semiconductor chip 102 embedded in the substrate 110). The chip arrangement 101 may enable short interconnect distances between the semiconductor chip 102 and the plurality of electronic devices 104. Furthermore, the thickness TE of the plurality of electronic devices 104 may not be a limiting factor in the chip arrangement 101.

The semiconductor chip 102 may include a plurality of pads 102d which may be used as an interface (e.g. electrical interface) to the semiconductor chip 102. A distance between adjacent pads may be referred to as a die pad pitch PD. In the chip arrangement 101, use of a standard die pad pitch PD may not be possible, thus making it difficult to integrate the semiconductor chip 102 into the substrate 110. For example, a minimum die pad pitch PD of about 200 μm may be needed in high volume manufacturing (HVM). Furthermore, the chip arrangement 101 may include routing 112 (e.g. electrical routing) for connecting the plurality of electronic devices 104 to the semiconductor chip 102. This may result in increased manufacturing complexity and costs. Even further, the semiconductor chip 102 may need to be thinned significantly (e.g. to less than or equal to about a thickness TS of the substrate 110). The thinning of the semiconductor chip 102 may weaken the robustness of the semiconductor chip 102 and/or may lead to a loss of yield in and/or poor reliability of the semiconductor chip 102.

In view of the above-described considerations of the chip arrangements 100 and 101, the following needs may be identified:

There may be a need to provide a chip arrangement (e.g. a chip package, e.g. an eWLB package) that may accommodate an electronic device (e.g. SMD component) and/or a semiconductor chip (e.g. daughter die) which may otherwise be too thick to be placed between an encapsulated semiconductor chip and a circuit board (e.g. printed circuit board).

There may be a need to provide a chip arrangement (e.g. a chip package, e.g. an eWLB package) that may allow a face-to-face arrangement of an encapsulated semiconductor chip and an electronic device (e.g. SMD component) and/or a semiconductor chip (e.g. daughter die).

There may be a need to provide a chip arrangement (e.g. a chip package, e.g. an eWLB package) that may minimize a distance of an electrical connection between an encapsulated semiconductor chip and an electronic device (e.g. SMD component) and/or a semiconductor chip (e.g. daughter die).

There may be a need to provide a chip arrangement (e.g. a chip package, e.g. an eWLB package) that may provide a reliable electrical connection between an encapsulated semiconductor chip and an electronic device (e.g. SMD component) and/or a semiconductor chip (e.g. daughter die), the electrical connection having good electrical performance (e.g. lower resistance and/or capacity and/or inductivity).

Figure 2:
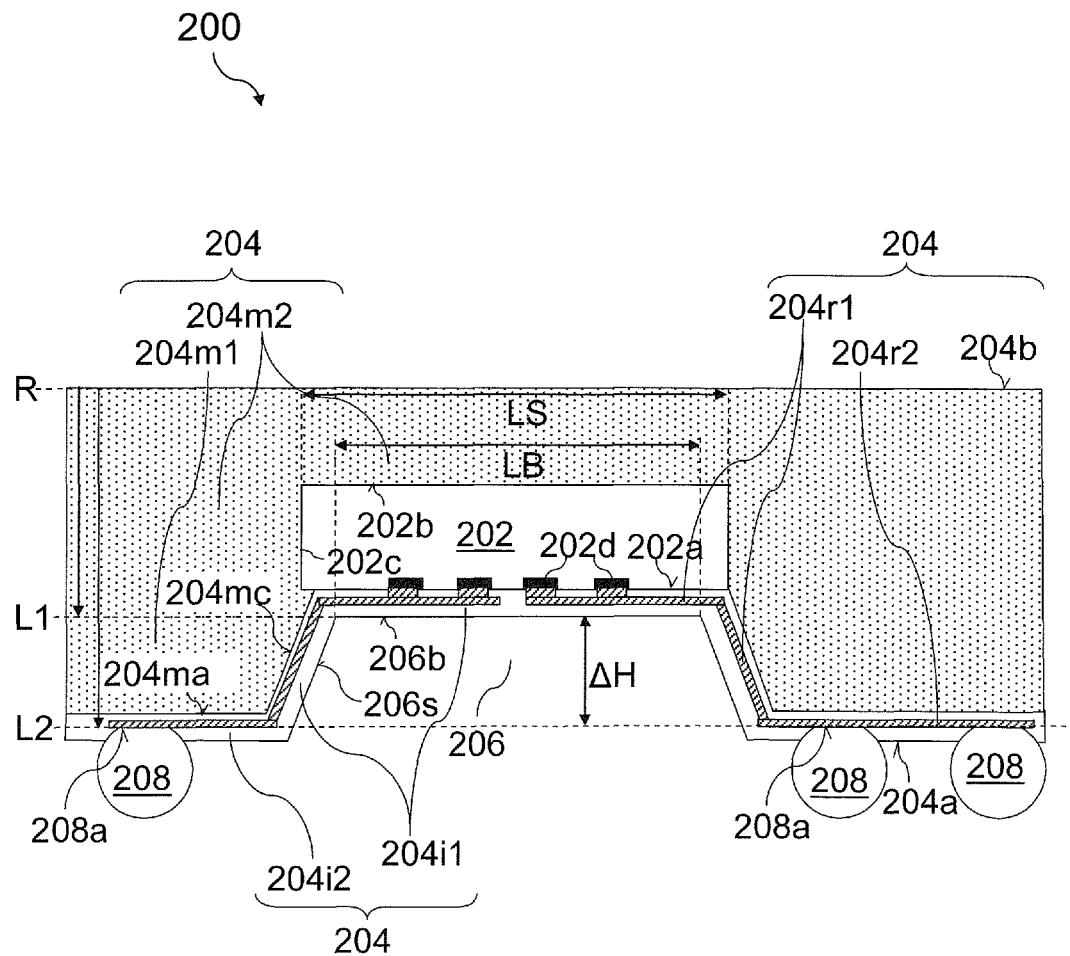
FIG. 2 shows a chip arrangement including a semiconductor chip, an encapsulating structure, a recess, and at least one electrical connector.

The above-identified needs may be met by the chip arrangement shown in FIG. 2.

FIG. 2 shows a chip arrangement 200 including a semiconductor chip 202, an encapsulating structure 204, a recess 206, and at least one electrical connector 208.

Only one semiconductor chip 202 is shown as an example, however the number of semiconductor chips 202 may be greater than one, and may, for example, be two, three, four, five, etc. For example, the chip arrangement 200 may include a plurality of semiconductor chips 202, which may, for example, be arranged laterally adjacent to each other. Similarly, only one recess 206 is shown as an example, however the number of recesses 206 may be greater than one, and may, for example, be two, three, four, five, etc. For example, the chip arrangement 200 may include a plurality of recesses 206, which may, for example, be arranged laterally adjacent to each other.

The chip arrangement 200 shown in FIG. 2 may, for example, be configured as a chip package. The chip arrangement 200 shown in FIG. 2 may, for example, be configured as a fan-out wafer level ball grid array (e.g. eWLB package). In other words, the semiconductor chip 202 may be packaged within the encapsulating structure 204 using a fan-out wafer level package process flow (e.g. eWLB process flow).

The semiconductor chip 202 may include a semiconductor substrate, which may include, or may consist of, a semiconductor material. The semiconductor material may include, or may be, at least one material selected from a group of materials, the group consisting of: silicon, germanium, gallium nitride, gallium arsenide, and silicon carbide, although other materials may be possible as well.

The semiconductor chip 202 may have a first side 202a and a second side 202b opposite the first side 202a. The semiconductor chip 202 may further have at least one sidewall 202c. The first side 202a and the second side 202b of the semiconductor chip 202 may include, or may be, a frontside and a backside of the semiconductor chip 202, respectively. By way of another example, the first side 202a of the semiconductor chip 202 may include, or may be, an active side of the semiconductor chip 202.

The semiconductor chip 202 may include at least one electrically conductive contact 202d, which may be disposed at (e.g. disposed on or over) the first side 202a (e.g. active side) of the semiconductor chip 202. The at least one electrically conductive contact 202d of the semiconductor chip 202 may include, or may be, a pad (e.g. a bonding and/or contact pad). The at least one electrically conductive contact 202d of the semiconductor chip 202 may provide an interface (e.g. an electrical interface) for the semiconductor chip 202. In other words, signals (e.g. electrical signals, power supply potentials, ground potentials, etc.) may be exchanged with the semiconductor chip 202 via the at least one electrically conductive contact 202d.

The semiconductor chip 202 may be at least partially encapsulated in the encapsulating structure 204 (which may include a plurality of structures as shown in FIG. 2). As used herein "at least partially encapsulated" may mean that the encapsulating structure 204 may enclose (e.g. cover) the semiconductor chip 202 from at least one sidewall 202c (e.g. from all sidewalls 202c) and the second side 202b. "At least partially encapsulated" may also mean that the encapsulating structure 204 may cover the semiconductor chip 202 from all sides. In other words, "at least partially encapsulated" may mean that the encapsulating structure 204 may enclose (e.g. cover) the semiconductor chip 202 from at least one sidewall 202c (e.g. from all sidewalls 202c), the first side 202a (e.g. active side), and the second side 202b. Stated in yet another way, "at least partially encapsulated" may mean that the encapsulating structure 204 may enclose (e.g. fully enclose, e.g. fully cover) the semiconductor chip 202 from all sides.

The encapsulating structure 204 may have a first side 204a and a second side 204b opposite the first side 204a. The first side 204a of the encapsulating structure 204 may, for example, be a frontside of the chip arrangement 200. The second side 204b of the encapsulating structure 204 may, for example, be a backside of the chip arrangement 200.

The encapsulating structure 204 may include a recess 206 over the first side 204a of the encapsulating structure 204. The semiconductor chip 202 may be arranged over the recess 206, as shown in FIG. 2. As described above, the first side 202a of the semiconductor chip 202 may include, or may be, an active side of the semiconductor chip 202. Accordingly, the active side of the semiconductor chip 202 may face the recess 206.

The recess 206 may include, or may be, at least one of a deepening, a hole, and a trench, although other types of recesses may be possible as well. The recess 206 may include a bottom surface 206b (which may be a ceiling or a floor of the recess 206) and at least one sidewall 206s. The bottom surface 206b of the recess 206 may be located at a first level L1. The first level L1 may, for example, be measured from a reference level R. In the example shown in FIG. 2, the reference level R may include, or may be, the second side 204b of the encapsulating structure 204. However, in another example, another reference level R may be chosen.

A lateral extent LS of the semiconductor chip 202 may be greater than or equal to a lateral extent LB of the bottom surface 206b of the recess 206. In the example shown in FIG. 2, the lateral extent LS of the semiconductor chip 202 is shown to be greater than the lateral extent LB of the bottom surface 206b of the recess 206. In another example, the lateral extent LS of the semiconductor chip 202 may be less than or equal to the lateral extent LB of the bottom surface 206b of the recess 206 (e.g. see description below in respect of FIG. 4).

The chip arrangement 200 may include at least one electrical connector 208. The at least one electrical connector 208 may be disposed at (e.g. disposed on or over) the first side 204a of the encapsulating structure 204 outside the recess 206. For example, the at least one electrical connector 208 may be disposed laterally adjacent to the recess 206 and at the first side 204a of the encapsulating structure 204. By way of another example, the at least one electrical connector 208 may be disposed at (e.g. disposed on or over) the first side 204a of the encapsulating structure 204 at or near a perimeter (or peripheral region) of the recess 206.

The at least one electrical connector 208 and the recess 206 may be located at different planes. In other words, the at least one electrical connector 208 and the bottom surface 206b of the recess 206 may not be co-planar. For example, a surface 208a of the at least one electrical connector 208 facing the encapsulating structure 204 may be disposed at a second level L2 different from the first level L1. The second level L2 may be measured from the same reference level R as the first level L1, which in the example shown in FIG. 2 may be the second side 204b of the encapsulating structure 204. The second level L2 may be located at a distance farther from the second side 204b of the encapsulating structure 204 than the first level L1. In other words, a distance from the second side 204b of the encapsulating structure 204 to the bottom surface 206b of the recess 206 may be less than a distance from the second side 204b of the encapsulating structure 204 to the surface 208a of the at least one electrical connector 208 facing the encapsulating structure 204.

There may be a height difference ΔH (which may also be referred to as an offset) between the first level L1 and the second level L2. The height difference ΔH (e.g. offset) between the first level L1 and the second level L2 may be in the range from about 100 μm to about 600 μm, for example in the range from about 150 μm to about 450 μm, for example in the range from about 200 μm to about 350 μm, for example in the range from about 200 μm to about 300 μm, although other height differences may be possible as well.

The height difference ΔH between the first level L1 and the second level L2 may depend on a size (e.g. a height and/or a depth) of the recess 206. Accordingly, the height difference ΔH between the first level L1 and the second level L2 be varied by, for example, varying a size (e.g. a height and/or a depth) of the recess 206 (e.g. in a process flow of an eWLB manufacturing process). The height difference ΔH between the first level L1 and the second level L2 may, for example, be varied in accordance with (or may depend on) a size of a structure and/or device that may be subsequently disposed in the recess 206.

The at least one electrical connector 208 may include, or may consist of, at least one electrically conductive material selected from a group of electrically conductive materials. The group of electrically conductive materials may consist of: a metal or metal alloy. For example, the at least one electrical connector 208 may consist of a solder material (e.g. an alloy of tin, silver, and copper). By way of another example, the at least one electrical connector 208 may consist of copper, palladium, titanium, chrome, tungsten, nickel, gold, aluminum or a conductive paste or a stack or alloy containing at least a part of the listed metals.

The at least one electrical connector 208 may include, or may be, at least one of a ball (e.g. a solder ball), a bump (e.g.

a solder ball), and a pillar (e.g. a copper pillar). The at least one electrical connector 208 may include, or may be, a ball grid array (BGA) of solder balls. The at least one electrical connector 208 may provide an interface for the chip arrangement 200. In other words, signals (e.g. electrical signals, power supply potentials, ground potentials, etc.) may be exchanged with semiconductor chip 202 via the at least one electrical connector 208 (e.g. BGA of solder balls).

The encapsulating structure 204 may include a mold compound 204$m$1, 204$m$2, which may at least partially encapsulate the semiconductor chip 202. As used herein "at least partially encapsulate" may mean that the mold compound 204$m$1, 204$m$2 may enclose (e.g. cover) the semiconductor chip 202 from at least one sidewall 202$c$ (e.g. from all sidewalls 202$c$) and the second side 202$b$. "At least partially encapsulate" may also mean that the mold compound 204$m$1, 204$m$2 may cover the semiconductor chip 202 from all sides. In other words, "at least partially encapsulate" may mean that the mold compound 204$m$1, 204$m$2 may enclose (e.g. cover) the semiconductor chip 202 from at least one sidewall 202$c$ (e.g. from all sidewalls 202$c$), the first side 202$a$ (e.g. active side), and the second side 202$b$. Stated in yet another way, "at least partially encapsulate" may mean that the mold compound 204$m$1, 204$m$2 may enclose (e.g. fully enclose, e.g. fully cover) the semiconductor chip 202 from all sides.

The mold compound 204$m$1, 204$m$2 of the encapsulating structure 204 may include, or may consist of, at least one polymer. The mold compound 204$m$1, 204$m$2 may include, or may consist of, a plastic material. The plastic material of the mold compound 204$m$1, 204$m$2 may include, or may consist of, a thermosetting molding compound (e.g. a resin, e.g. an epoxy resin). By way of another example, the plastic material of the mold compound 204$m$1, 204$m$2 may include, or may consist of, a thermoplastic (e.g. a high purity fluoropolymer). The mold compound 204$m$1, 204$m$2 of the encapsulating structure may include a filler material (e.g. including, or consisting of, at least one of a silica filler, a glass filler, a glass cloth, rubber and metal particles).

The mold compound 204$m$1, 204$m$2 may include a first side 204$ma$ opposite the second side 204$b$ of the encapsulating structure 204. The second side 204$b$ of the encapsulating structure may be a second side of the mold compound 204$m$1, 204$m$2. The first side 204$ma$ of the mold compound 204$m$1, 204$m$2 may be disposed outside the recess 206, and may be at least substantially planar. In other words, the first side 204$ma$ of the mold compound 204$m$1, 204$m$2 (e.g. disposed outside the recess 206) may be approximately or exactly flat. The mold compound 204$m$1, 204$m$2 may include a third side 204$mc$, which may be disposed laterally adjacent to the at least one sidewall 206$s$ of the recess 206.

The mold compound 204$m$1, 204$m$2 may include a portion 204$m$1, which may be disposed laterally adjacent to the recess 206 (e.g. laterally adjacent to the at least one sidewall 206$s$ of the recess 206). In other words, the portion 204$m$1 of the mold compound 204$m$1, 204$m$2 may surround the recess 206 from its at least one sidewall 206$s$. The mold compound 204$m$1, 204$m$2 may include a portion 204$m$2, which may be disposed laterally adjacent to the at least one sidewall 202$c$ of the semiconductor chip 202. The portion 204$m$2 of the mold compound 204$m$1, 204$m$2 may be disposed at (e.g. disposed on or over) the second side 202$b$ of the semiconductor chip 202, as shown in FIG. 2.

The encapsulating structure 204 may include a redistribution structure 204$r$1, 204$r$2, which may have a first portion 204$r$1 and/or a second portion 204$r$2. The first portion 204$r$1 of the redistribution structure 204$r$1, 204$r$2 may be disposed at least at (e.g. disposed at least below or under) the bottom surface 206$b$ of the recess 206 and/or disposed laterally adjacent to the at least one sidewall 206$s$ of the recess 206. The second portion 204$r$2 of the redistribution structure 204$r$1, 204$r$2 may be disposed outside the recess 206 (e.g. on or over the first side 204$ma$ of the of the mold compound 204$m$1, 204$m$2).

The redistribution structure 204$r$1, 204$r$2 may, for example, include, or may consist of, at least one electrically conductive material, e.g. at least one metal and/or metal alloy. The at least one electrically conductive material may be selected from a group of electrically conductive materials. The group of electrical conductive materials may consist of: aluminum, tungsten, titanium, chrome, copper, nickel, palladium and gold, although other electrically conductive materials may be possible as well. The redistribution structure 204$r$1, 204$r$2 may, for example, include, or may consist of a conductive paste (polymer, filled with electrically conductive particles).

The redistribution structure 204$r$1, 204$r$2 may include, or may be, a redistribution layer (RDL). As described above, the first side 204$a$ of the encapsulating structure 204 may, for example, be the frontside of the chip arrangement 200. Accordingly, the redistribution structure 204$r$1, 204$r$2 may include, or may be, a frontside RDL.

The encapsulating structure 204 may include an insulating layer 204$i$1, 204$i$2, which may have a first portion 204$i$1 and/or a second portion 204$i$2. The first portion 204$i$1 of the insulating layer 204$i$1, 204$i$2 may be disposed at least at (e.g. disposed at least below or under) the bottom surface 206$b$ of the recess 206 and/or disposed laterally adjacent to the at least one sidewall 206$s$ of the recess 206. The first portion 204$i$1 of the insulating layer 204$i$1, 204$i$2 may, for example, be included with (e.g. may be a part of) the semiconductor chip 202, e.g. prior to manufacturing the chip arrangement 200. In other words, manufacturing the chip arrangement 200 may include providing the semiconductor chip 202 having the first portion 204$i$1 of the insulating layer 204$i$1, 204$i$2, e.g. disposed at the first side 202$a$ of the semiconductor chip 202. For example, the first portion 204$i$1 of the insulating layer 204$i$1, 204$i$2 may be formed over (e.g. applied and/or deposited on or over) a wafer including a plurality of semiconductor chips 202. In such an example, the first portion 204$i$1 of the insulating layer 204$i$1, 204$i$2 may be formed over (e.g. applied and/or deposited on or over) the first side 202$a$ of each semiconductor chip 202 of the wafer. The wafer may be subsequently singulated, thus separating the plurality of semiconductor chips 202, each semiconductor chip 202 having the first portion 204$i$1 of the insulating layer 204$i$1, 204$i$2 disposed at the first side 202$a$.

The first portion 204$i$1 of the insulating layer 204$i$1, 204$i$2 may include, or may be, a dielectric layer. In an example where the first side 202$a$ of the semiconductor chip 202 may be a frontside of the semiconductor chip 202, the first portion 204$i$1 of the insulating layer 204$i$1, 204$i$2 may include, or may be, a front-end (e.g. front-side) dielectric of the semiconductor chip 202. The first portion 204$i$1 of the insulating layer 204$i$1, 204$i$2 (e.g. dielectric layer) may include, or may consist of, a polyimide and/or a poly-p-phenylene-benzobisoxazole (PBO).

The second portion 204$i$2 of the insulating layer 204$i$1, 204$i$2 may be disposed outside the recess 206 (e.g. on or over the first side 204$ma$ of the of the mold compound 204$m$1, 204$m$2). The second portion 204$i$2 of the insulating layer 204$i$1, 204$i$2 may include, or may be, a dielectric layer. The insulating layer 204$i$1, 204$i$2 may further include a solder stop layer (e.g. in addition to a dielectric layer). In such an example, the solder stop layer of the insulating layer 204$i$1, 204i2 may, for example, be disposed over the dielectric layer of the insulating layer 204i1, 204i2 disposed at the first side 202a of the semiconductor chip 202. In other words, the dielectric layer of the insulating layer 204i1, 204i2 may be disposed between the semiconductor chip 202 and the solder stop layer of the insulating layer 204i1, 204i2.

The redistribution structure 204r1, 204r2 (e.g. RDL) may include, or may be, a single-level (e.g. a single layer) RDL. For example, the redistribution structure 204r1, 204r2 may include, or may be, a single-level RDL that may include a single layer (e.g. single metal layer) disposed within the insulating layer 204i1, 204i2, which may include, or may consist of, one, two or more dielectric layers. The redistribution structure 204r1, 204r2 (e.g. RDL) may include, or may be, a multi-level (e.g. a multi-layer) RDL. For example, the redistribution structure 204r1, 204r2 may include, or may be, a multi-level RDL that may include at least two layers (e.g. at least two metal layers) disposed within the insulating layer 204i1, 204i2, which may include, or may consist of, one, two, three or more dielectric layers.

The redistribution structure 204r1, 204r2 may be electrically coupled to the semiconductor chip 202 (e.g. to the at least one electrically conductive contact 202d of the semiconductor chip 202). The redistribution structure 204r1, 204r2 may be electrically coupled to the at least one electrical connector 208. Accordingly, signals (e.g. electrical signals, power supply potentials, ground potentials, etc.) may be exchanged with semiconductor chip 202 via the at least one electrical connector 208 (e.g. BGA of solder balls) and the redistribution structure 204r1, 204r2.

Figure 4:
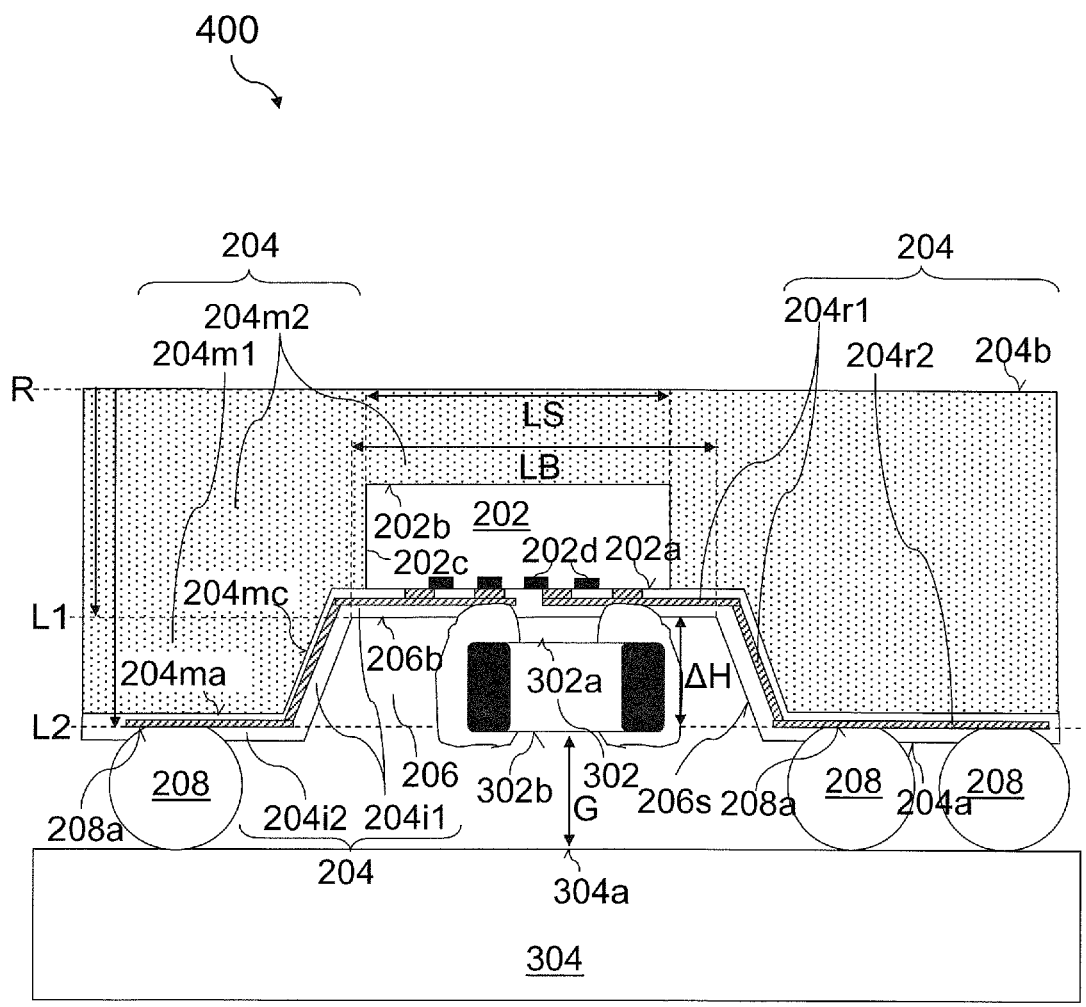
FIG. 4 shows a chip arrangement including a semiconductor chip, an encapsulating structure, a recess, at least one electrical connector, and an electronic device disposed at least partially within the recess, where a lateral extent of the semiconductor chip is less than a lateral extent of a bottom surface of the recess.
Figure 5:
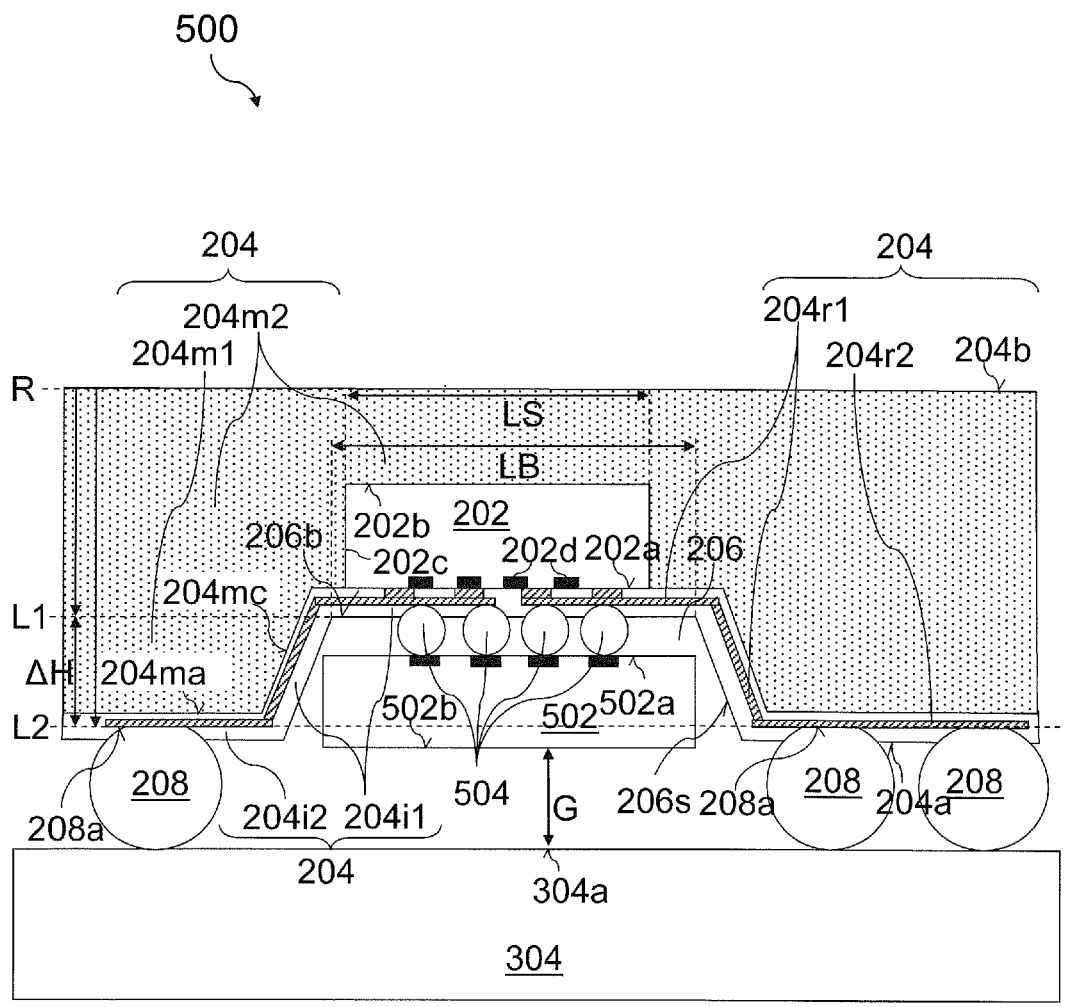
FIG. 5 shows a chip arrangement including a semiconductor chip, an encapsulating structure, a recess, at least one electrical connector, and a second semiconductor chip disposed at least partially within the recess.

An aspect of the chip arrangement 200 may be that the recess 206 may be used to accommodate (e.g. receive by means of a pick and place process) an electronic device and/or another semiconductor chip, which would otherwise be too thick to be placed laterally adjacent to the at least one electrical connector 208 (e.g. between a BGA of solder balls) for a face-to-face arrangement with the semiconductor chip 202. In other words, an electronic device and/or another semiconductor chip may be disposed at least partially within the recess 206. Such an arrangement is shown in FIG. 3 to FIG. 5.

Figure 6:
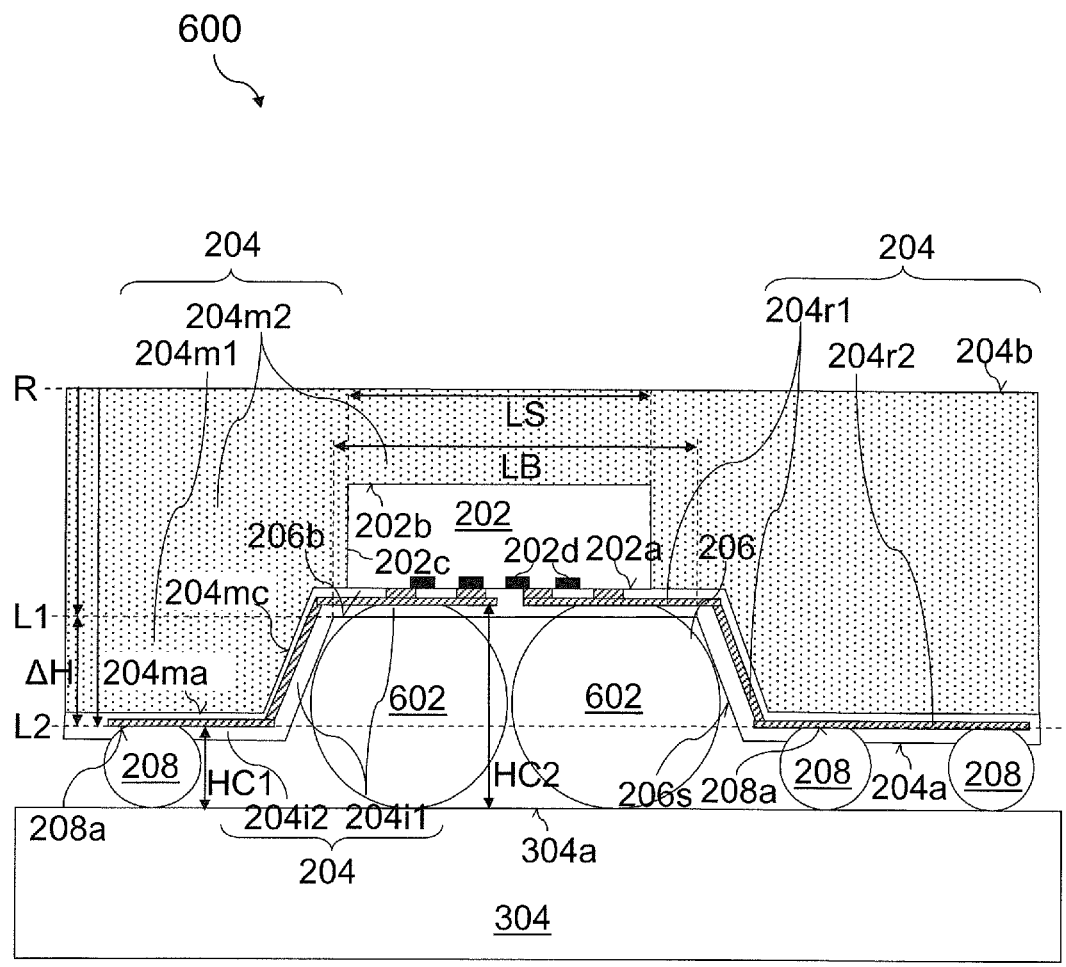
FIG. 6 shows a chip arrangement including a semiconductor chip, an encapsulating structure, a recess, at least one electrical connector disposed outside the recess, and at least one second electrical connector disposed at least partially within the recess.

An aspect of the chip arrangement 200 may be that the recess 206 may be used to accommodate (e.g. receive by means of a pick and place process) at least one second electrical connector (e.g. a ball, a bump, a pillar), which may be larger (e.g. have a larger height and/or larger diameter) than the at least one electrical connector 208. In other words, at least one second electrical connector (e.g. a ball, a bump, a pillar) may be disposed at least partially within the recess 206, and may be used to alleviate and/or mitigate stress (e.g. mechanical stress) experienced by the semiconductor chip 202. Such an arrangement is shown in FIG. 6.

Figure 3:
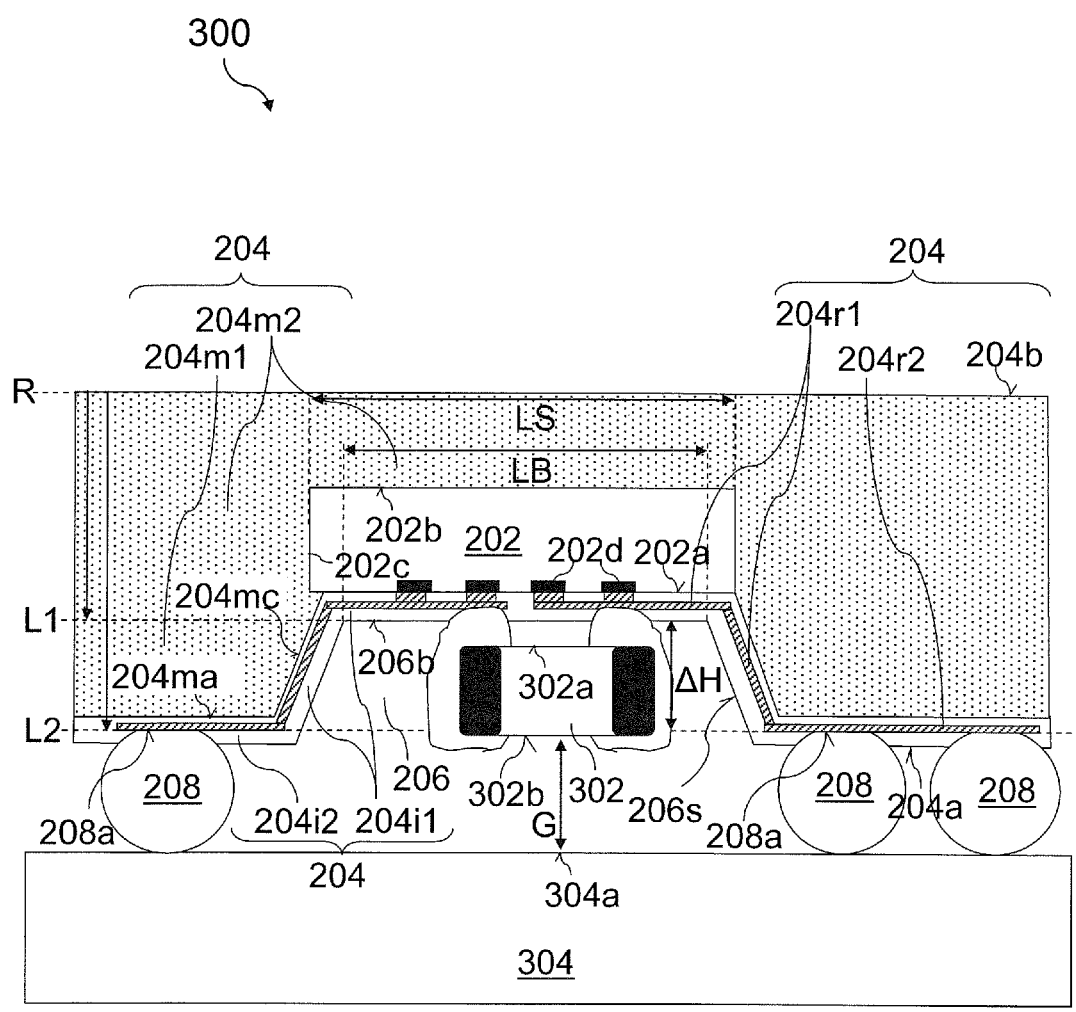
FIG. 3 shows a chip arrangement including the chip arrangement shown in FIG. 2 and an electronic device disposed at least partially within a recess.

FIG. 3 shows a chip arrangement 300 including the chip arrangement 200 shown in FIG. 2 and an electronic device 302 disposed at least partially within the recess 206.

Reference signs in FIG. 3 that are the same as in FIG. 2 denote the same or similar elements as in FIG. 2. Thus, those elements will not be described in detail again here; reference is made to the description above. Differences between FIG. 3 and FIG. 2 are described below.

Only one electronic device 302 is shown as an example, however the number of electronic devices 302 may be more than one, or may, for example, be two, three, four, five, etc. For example, the chip arrangement 300 may include a plurality of electronic devices 302 disposed laterally adjacent to each other and at least partially within the recess 206.

The electronic device 302 may include, or may be, a surface-mount device (SMD) or component. For example, the electronic device 302 may include, or may be, a passive SMD (e.g. a surface-mount resistor and/or capacitor and/or inductor).

The electronic device 302 may have a first side 302a and a second side 302b opposite the first side 202a. The first side 302a and the second side 302b of the electronic device 302 may include, or may be, a frontside and a backside of the electronic device 302, respectively. By way of another example, the first side 302a of the electronic device 302 may include, or may be, an active side of the electronic device 302. The first side 302a (e.g. active side) of the electronic device 302 may face the first side 202a (e.g. active side) of the semiconductor chip 202. In an example where the first side 202a and first side 302a are active sides of the semiconductor chip 202 and the electronic device 302, respectively, the arrangement may be referred to as a face-to-face arrangement.

The electronic device 302 may be disposed at least partially within the recess. As used herein "disposed at least partially within the recess" may mean that a portion of the electronic device 302 may be disposed within the recess and another portion of the electronic device 302 may be disposed outside the recess (e.g. in a direction perpendicular) to the bottom surface 206b of the recess 206. In another example, "disposed at least partially within the recess" may mean that the electronic device 302 may be fully disposed within the recess 206, e.g. such that the second side 302b of the electronic device 302 is located at a distance closer to the bottom surface 206b of the recess 206 than the first side 204a of the encapsulating structure 204.

The chip arrangement 300 may include a circuit board 304 (e.g. a customer board, e.g. a printed circuit board), which may be in contact (e.g. physical contact, e.g. direct physical contact) with the at least one electrical connector 208. For example, in the chip arrangement 300 shown in FIG. 3, the circuit board 304 may be in contact (e.g. physical contact, e.g. direct physical contact) with a surface of the at least one electrical connector 208 opposite the surface 208a of the at least one electrical connector 208 facing the encapsulating structure 204 (e.g. the mold compound 204m1, 204m2 of the encapsulating structure 204).

The recess 206 may be used to accommodate the electronic device 302, which would otherwise be too thick to be placed laterally adjacent to the at least one electrical connector 208 (e.g. between a BGA of solder balls), e.g. for a face-to-face arrangement with the semiconductor chip 202. In other words, the electronic device 302 may be too thick to be placed between the semiconductor chip 202 and the circuit board 304, if not for the recess 206. Accordingly, there may be a gap G disposed between the second side 302b of the electronic device 302 and a surface 304a of the circuit board facing the electronic device 302.

As described above in relation to FIG. 2, the height difference ΔH between the first level L1 and the second level L2 may depend on a size (e.g. a height and/or a depth) of the recess 206. Accordingly, the height difference ΔH between the first level L1 and the second level L2 be varied by, for example, varying a size (e.g. a height and/or a depth) of the recess 206. Consequently, a size (e.g. a height and/or a depth) of the recess 206 may be varied to accommodate electronic devices 302 having various form factors (i.e. dimensions, e.g. thicknesses, widths, lengths).

The electronic device 302 may be electrically coupled to the semiconductor chip 202. In other words, the electronic device 302 may exchange electrical signals with the semiconductor chip 202 via an interconnection between the electronic device 302 and the semiconductor chip 202. As shown in FIG.

3, the first side 302a (e.g. active side) of the electronic device 302 may face the first side 202a (e.g. active side) of the semiconductor chip 202. In other words, the first side 302a (e.g. active side) of the electronic device 302 may face the bottom surface 206b of the recess 206. In an example where the first sides 202a and the first side 302a are active sides of the semiconductor chip 202 and the electronic device 302, respectively, the semiconductor chip 202 and the electronic device 302 may be arranged in a face-to-face configuration. In such an example, a length (or distance) of the interconnection between the electronic device 302 and the semiconductor chip 202 may be minimized.

An effect provided by the chip arrangement 300 may be accommodation of the electronic device 302 which may otherwise be too thick to be placed between the semiconductor chip 202 and the circuit board 304.

An effect provided by the chip arrangement 300 may be provision of a face-to-face arrangement of the semiconductor chip 202 and the electronic device 302.

An effect provided by the chip arrangement 300 may be a minimization of a distance of an electrical connection between the semiconductor chip 202 and the electronic device 302.

An effect provided by the chip arrangement 300 may be provision of a reliable electrical connection between the semiconductor chip 202 and the electronic device 302 that may have good electrical performance (e.g. lower resistance and/or capacity and/or inductivity).

As described above, the lateral extent LS of the semiconductor chip 202 may be less than or equal to the lateral extent LB of the bottom surface 206b of the recess 206. Such an example is shown in FIG. 4.

FIG. 4 shows a chip arrangement 400 including the semiconductor chip 202, the encapsulating structure 204, the at least one electrical connector 208, and the electronic device 302 disposed at least partially within the recess 206, where the lateral extent LS of the semiconductor chip 202 is less than the lateral extent LB of the bottom surface 206b of the recess 206.

Reference signs in FIG. 4 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 400 shown in FIG. 4. Differences between FIG. 4 and FIG. 3 are described below.

As shown in FIG. 4, the semiconductor chip 202 may be disposed laterally within a boundary of the bottom surface 206b of the recess 206. In other words, the lateral extent LS of the semiconductor chip 202 may be within the lateral extent LB of the bottom surface 206b of the recess 206. Stated in yet another way, the bottom surface 206b of the recess 206 may extend laterally beyond the semiconductor chip 202 (e.g. a boundary of the semiconductor chip 202).

As described above in relation to FIG. 2, the first portion 204i1 of the insulating layer 204i1, 204i2 may include, or may consist of, a dielectric layer. In such an example, the dielectric layer of the first portion 204i1 of the insulating layer 204i1, 204i2 may include a first portion. The first portion of the dielectric layer of the first portion 204i1 of the insulating layer 204i1, 204i2 may be disposed at (e.g. disposed on or over) the first side 202a of the semiconductor chip 202. A lateral extent of the first portion of the dielectric layer of the first portion 204i1 of the insulating layer 204i1, 204i2 may, for example, be at least substantially equal to the lateral extent LS of the semiconductor chip 202. The first portion of the dielectric layer of the first portion 204i1 of the insulating layer 204i1, 204i2 may be included with (e.g. may be a part of) the semiconductor chip 202, e.g. prior to manufacturing the chip arrangement 200.

Furthermore, the dielectric layer of the first portion 204i1 of the insulating layer 204i1, 204i2 may include a second portion. The second portion of the dielectric layer of the first portion 204i1 of the insulating layer 204i1, 204i2 may be disposed on and/or laterally adjacent to the first portion of the dielectric layer of the first portion 204i1 of the insulating layer 204i1, 204i2. The second portion of the dielectric layer of the first portion 204i1 of the insulating layer 204i1, 204i2 may, for example, be formed (e.g. on and/or laterally adjacent to the first portion of the dielectric layer of the first portion 204i1 of the insulating layer 204i1, 204i2) during a manufacturing of the chip arrangement 400.

In another example, the dielectric layer of the first portion 204i1 of the insulating layer 204i1, 204i2 may, for example, be disposed at (e.g. on or over) the first side 202a of the semiconductor chip 202 only, and may have a lateral extent at least substantially equal to the lateral extent LS of the semiconductor chip 202. In such an example, the rest of the first portion 204i1 of the insulating layer 204i1, 204i2 may include, or may consist of, a solder stop layer.

FIG. 5 shows a chip arrangement 500 including the semiconductor chip 202, the encapsulating structure 204, the at least one electrical connector 208, and a second semiconductor chip 502 disposed at least partially within the recess 206.

Reference signs in FIG. 5 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 500 shown in FIG. 5. Differences between FIG. 5 and FIG. 3 are described below.

Only one second semiconductor chip 502 is shown as an example, however the number of second semiconductor chips 502 may be more than one, or may, for example, be two, three, four, five, etc. For example, the chip arrangement 500 may include a plurality of second semiconductor chips 502 disposed laterally adjacent to each other and at least partially within the recess 206. Furthermore, the example of FIG. 5 shows that the lateral extent LS of the semiconductor chip 202 may be within the lateral extent LB of the bottom surface 206b of the recess 206. However, in another example, the lateral extent LS of the semiconductor chip 202 may greater than or equal to the lateral extent LB of the bottom surface 206b of the recess 206.

The second semiconductor chip 502 may have a first side 502a and a second side 502b opposite the first side 502a. The first side 502a and the second side 502b of the electronic device 502 may include, or may be, a frontside and a backside of the second semiconductor chip 502, respectively. By way of another example, the first side 502a of the second semiconductor chip 502 may include, or may be, an active side of the second semiconductor chip 502. The first side 502a (e.g. active side) of the second semiconductor chip 502 may face the first side 202a (e.g. active side) of the semiconductor chip 202. In an example where the first side 202a and first side 502a are active sides of the semiconductor chip 202 and the second semiconductor chip 502, respectively, the arrangement may be referred to as a face-to-face arrangement.

As shown in FIG. 5, the second semiconductor chip 502 may be disposed at least partially within the recess. As used herein "disposed at least partially within the recess" may mean that a portion of the second semiconductor chip 502 may be disposed within the recess and another portion of the second semiconductor chip 502 may be disposed outside the recess (e.g. in a direction perpendicular to the bottom surface 206b of the recess 206). In another example, "disposed at least partially within the recess" may mean that the second semiconductor chip 502 may be fully disposed within the recess 206, e.g. such that the second side 502b of the second semiconductor chip 502 is closer to the bottom surface 206b of the recess 206 than the second side 204b of the encapsulating structure 204.

The second semiconductor chip 502 may include, or may be, at least one of a microelectromechanical systems (MEMS) device, an application-specific integrated circuit, an active device (e.g. a transistor), and a passive device (e.g. a resistor and/or inductor and/or capacitor).

The chip arrangement 500 arrangement formed by the semiconductor chip 202 and the second semiconductor chip 502 may be referred to as an mother-daughter die WLB (wafer level ball grid array) package. The semiconductor chip 202 may, for example, be configured as a mother die or a carrier die, and the second semiconductor chip 502 may be configured as a daughter die.

The second semiconductor chip 502 may be electrically coupled to the semiconductor chip 202, e.g. by means of at least one electrically conductive interconnect 504. The at least one electrically conductive interconnect 504 may include, or may be, a redistribution structure, a bump structure, and a metallization (e.g. a bump metallization, e.g. an under-bump metallization), although other intervening structures between the second semiconductor chip 502 and the semiconductor chip 202 may be possible as well.

In a conventional approach, the second semiconductor chip 502 may be accommodated at least partially within the recess 206 by reducing a thickness of the second semiconductor chip 502 (e.g. by means of a thinning process, e.g. a grinding process). However, this may affect a reliability of the second semiconductor chip 502. However, in the chip arrangement 500, the second semiconductor chip 502 may be accommodated by varying the height difference ΔH between the first level L1 and the second level L2, which may depend on a size (e.g. a height and/or a depth) of the recess 206. Consequently, a size (e.g. a height and/or a depth) of the recess 206 may be varied to accommodate one or more second semiconductor chips 502 having various form factors (i.e. dimensions, e.g. thicknesses, widths, lengths).

In addition, the second semiconductor chip 502 may be accommodated at least partially within the recess 206 by varying a height of the at least one electrically conductive interconnect 504 (e.g. solder ball). For example, in case a pitch of the at least one electrically conductive interconnect 504 may be in the range of about 0.3 mm, a height of the electrically conductive interconnect 504 may be reduced to accommodate the second semiconductor chip 502 at least partially within the recess 206.

An effect provided by the chip arrangement 500 may be accommodation of the second semiconductor chip 502 (e.g. daughter die) which may otherwise be too thick to be placed between the semiconductor chip 202 and the circuit board 304.

An effect provided by the chip arrangement 500 may be provision of a face-to-face arrangement of the semiconductor chip 202 and the second semiconductor chip 502 (e.g. daughter die).

An effect provided by the chip arrangement 500 may be a minimization of a distance of an electrical connection between the semiconductor chip 202 and the second semiconductor chip 502 (e.g. daughter die).

An effect provided by the chip arrangement 500 may be provision of a reliable electrical connection between the semiconductor chip 202 and the second semiconductor chip 502 (e.g. daughter die) that may have good electrical performance (e.g. lower resistance and/or capacity and/or inductivity) of an electrical connection between the semiconductor chip 202.

An effect provided by the chip arrangement 500 may be prevention of a thinning of the second semiconductor chip 502 (e.g. daughter die), which may adversely affect a reliability and/or an electrical performance of the second semiconductor chip 502 (e.g. daughter die).

As described above, the recess 206 may be used to accommodate (e.g. receive) at least one second electrical connector (e.g. a ball, a bump, a pillar), which may be larger (e.g. have a larger height and/or larger diameter) than the at least one electrical connector 208. Such an arrangement is shown in FIG. 6.

FIG. 6 shows a chip arrangement 600 including the semiconductor chip 202, the encapsulating structure 204, the recess 206, the at least one electrical connector 208 disposed outside the recess 206, and at least one second electrical connector 602 disposed at least partially within the recess 206.

Reference signs in FIG. 6 that are the same as in FIG. 3 denote the same or similar elements as in FIG. 3. Thus, those elements will not be described in detail again here; reference is made to the description above. The various effects described above in relation to the chip arrangement 300 shown in FIG. 3 may be analogously valid for the chip arrangement 600 shown in FIG. 6. Differences between FIG. 6 and FIG. 3 are described below.

Only two second electrical connectors 602 are shown as an example, however the number of second electrical connectors 602 may be one, or more than one, or may, for example, be three, four, five, etc. Furthermore, the example of FIG. 6 shows that the lateral extent LS of the semiconductor chip 202 may be within the lateral extent LB of the bottom surface 206b of the recess 206. However, in another example, the lateral extent LS of the semiconductor chip 202 may greater than or equal to the lateral extent LB of the bottom surface 206b of the recess 206.

As shown in FIG. 6, the at least one second electrical connector 602 may be disposed at least partially within the recess, and may, for example, be electrically coupled to the semiconductor chip 202. As used herein "disposed at least partially within the recess" may mean that a portion of the at least one second electrical connector 602 may be disposed within the recess and another portion of the at least one second electrical connector 602 may be disposed outside the recess (e.g. in a direction perpendicular) to the bottom surface 206b of the recess 206.

As shown in FIG. 6, the at least one second electrical connector 602 may be larger than the at least one electrical connector 208. For example, a height HC1 of the at least one electrical connector 208 may be less than a height HC2 of the at least one second electrical connector 602.

A consequence of the height HC2 of the at least one second electrical connector 602 being greater than the height HC1 of the at least one electrical connector 208 may be that a surface of the at least one second electrical connector 602 facing away from the second side 204b of the encapsulating structure 204 may be at least substantially flush with the surface of the at least one electrical connector 208 facing away from the second side 204b of the encapsulating structure 204. In other words, the surfaces of the at least one electrical connector 208 and the at least one second electrical connector 602 at a greatest extent from the encapsulating structure 204 may be at a same plane or same level. Accordingly, the circuit board 304 (e.g. a customer board, e.g. a printed circuit board), which may be in contact (e.g. physical contact, e.g. direct physical contact) with the at least one electrical connector 208 may also be in contact (e.g. physical contact, e.g. direct physical contact) with the at least one second electrical connector 602, as shown in FIG. 6.

The at least one second electrical connector 602 may include, or may consist of, at least one electrically conductive material selected from a group of electrically conductive materials. The group of electrically conductive materials may consist of: a metal or metal alloy. For example, the at least one second electrical connector 602 may consist of a solder material (e.g. an alloy of tin, silver, and copper). By way of another example, the at least one second electrical connector 602 may consist of copper, palladium, titanium, chrome, tungsten, nickel, gold, aluminum or a conductive paste or a stack or alloy containing at least a part of the listed metals.

The at least one second electrical connector 602 may include, or may be, at least one of a ball (e.g. a solder ball), a bump (e.g. a solder ball), and a pillar (e.g. a copper pillar). The at least one second electrical connector 602 may include, or may be, a ball grid array (BGA) of solder balls. The at least one second electrical connector 602 may provide an interface for the chip arrangement 600. In other words, signals (e.g. electrical signals, power supply potentials, ground potentials, etc.) may be exchanged with semiconductor chip 202 via the at least one second electrical connector 602 (e.g. BGA of solder balls).

The recess 206 may be formed at a portion of the chip arrangement 600 that may experience stress (e.g. mechanical stress). Accordingly, the at least one second electrical connector 602 (e.g. larger than the at least one electrical connector 208) disposed at least partially within the recess 206 may alleviate, mitigate, or eliminate the stress (e.g. mechanical stress) exerted at that portion of the chip arrangement 600. Consequently, an effect provided by the chip arrangement 600 may be reduction or elimination of stress exerted on the semiconductor chip 202.

The reduction or elimination of stress exerted on the semiconductor chip 202 may improve a reliability of an electrical connection to and/or from the semiconductor chip 202. The reduction or elimination of stress exerted on the semiconductor chip 202 may improve an electrical performance of the electrical connection. Consequently, an effect provided by the chip arrangement 600 may be provision of a reliable electrical connection to and/or from the semiconductor chip 202 that may have good electrical performance (e.g. lower resistance and/or capacity and/or inductivity).

Figure 7:
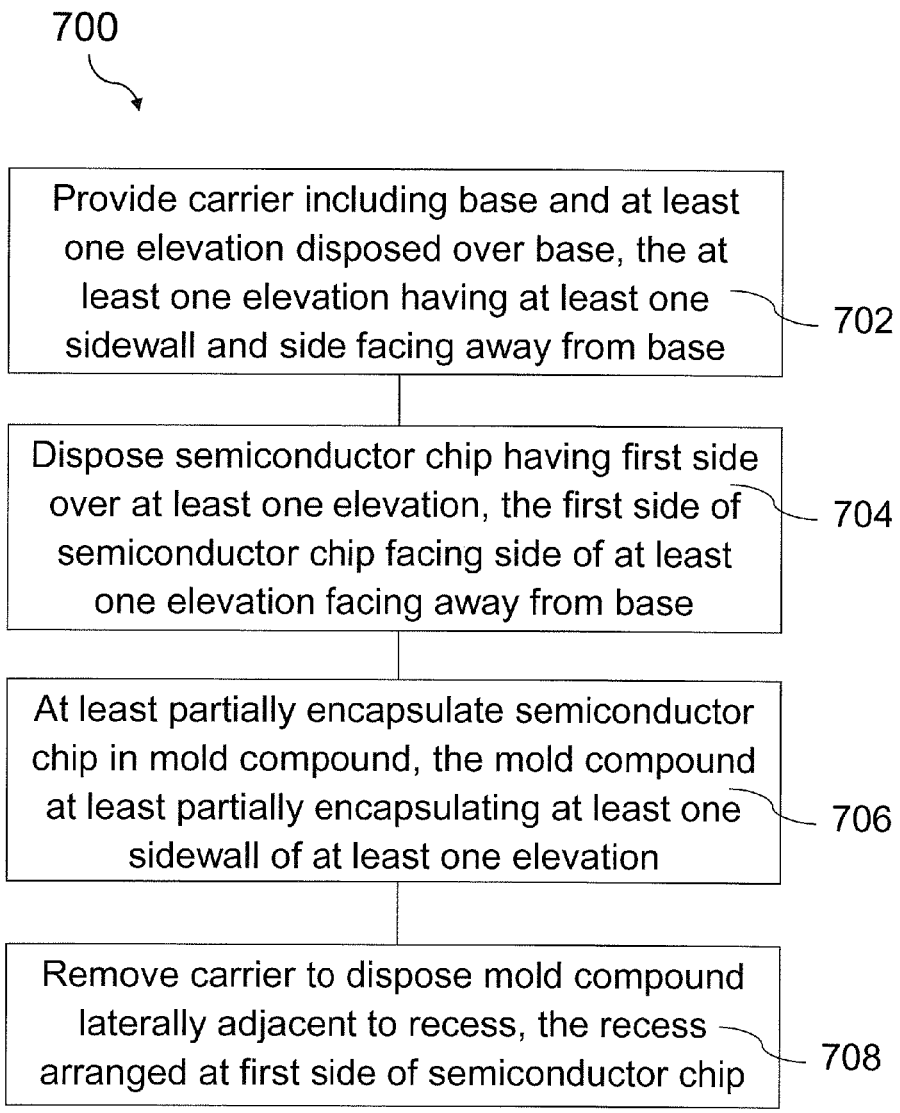
FIG. 7 shows a method for manufacturing a chip arrangement.

FIG. 7 shows a method 700 for manufacturing a chip arrangement.

The method 700 may, for example, be used to manufacture at least one of the chip arrangements 200 to 600, or variants thereof.

The method 700 may include: providing a carrier including a base and at least one elevation disposed over the base, the at least one elevation having at least one sidewall and a side facing away from the base (in 702); disposing a semiconductor chip having a first side over the at least one elevation, the first side of the semiconductor chip facing the side of the at least one elevation facing away from the base (in 704); at least partially encapsulating the semiconductor chip in a mold compound, the mold compound at least partially encapsulating the at least one sidewall of the at least one elevation (in 706); and removing the carrier to dispose the mold compound laterally adjacent to a recess, the recess arranged at the first side of the semiconductor chip (in 708).

FIG. 8A to FIG. 8K show a process flow for a method for manufacturing a chip arrangement.

The process flow shown in FIG. 8A to 8K may, for example, be used to manufacture at least one of the chip arrangements 200 to 400. Elements in FIG. 8A to FIG. 8K and FIG. 2 to FIG. 4 with similar identical reference numbers may refer to the same features.

Figure 8A:
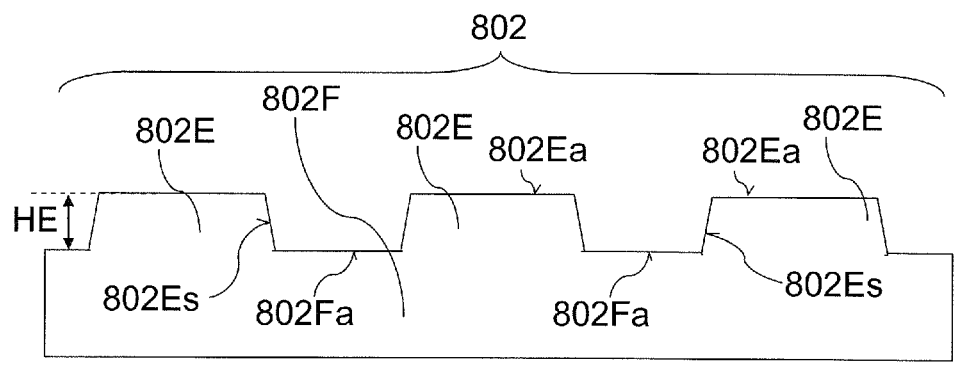
FIG. 8A to FIG. 8K show a process flow for a method for manufacturing a chip arrangement.

FIG. 8A shows a carrier 802 that may be provided. The carrier 802 may include a base 802F and at least one elevation 802E (e.g. a plurality of elevations 802E, e.g. as shown in FIG. 8A) disposed over (e.g. disposed on) the base 802F. The elevation 802E may, for example, extend above the base 802F. The elevation 802E may have at least one sidewall 802Es and a side 802Ea facing away from the base 802F. The side 802Ea may, for example, be a side of the elevation 802E farthest from the base 802F, and may, for example, be a top side of the elevation 802E. The base 802F may include a side 802Fa, which may face in a direction identical to a direction to which the side 802Ea of the elevation 802E faces. The side 802Fa of the base 802F may be at a different level from the side 802Ea of the elevation 802E, as shown in FIG. 8A. The description that follows may describe an example where the carrier 802 includes a plurality of elevations 802E, however, the description may be analogously valid for examples where the carrier 802 includes only one elevation 802E.

Figure 9:
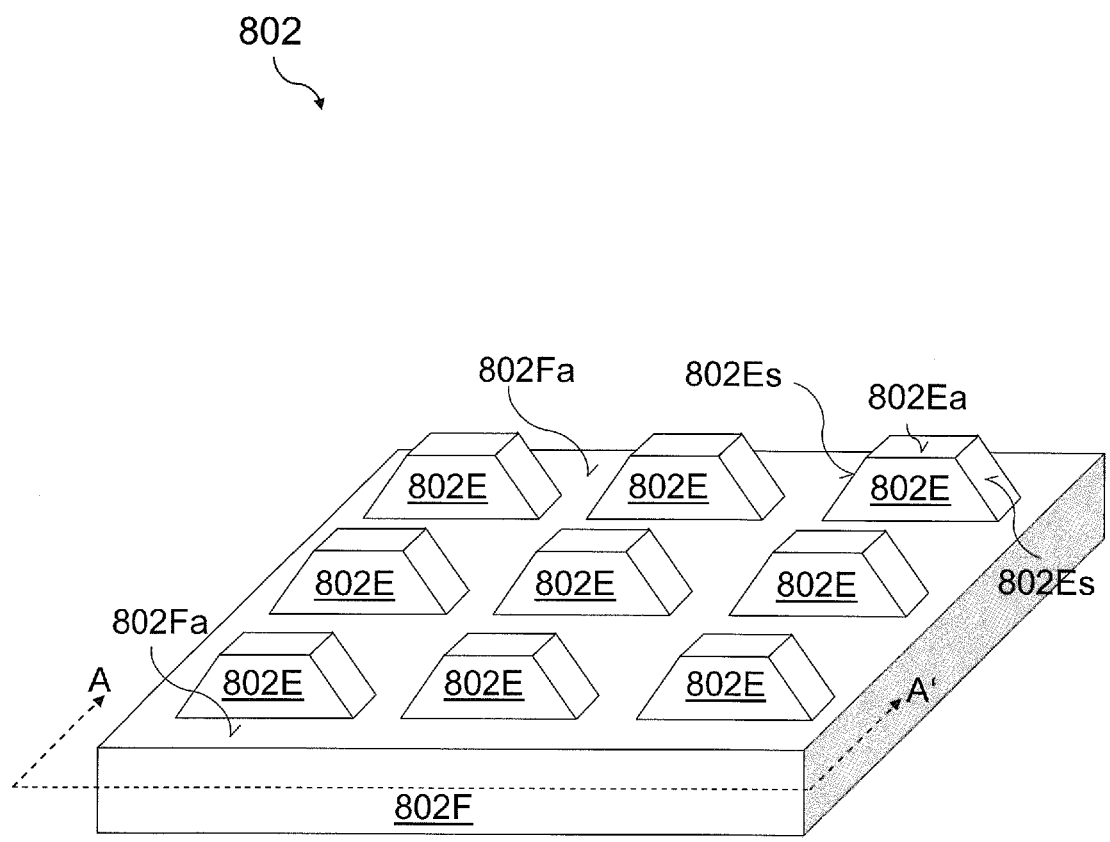
FIG. 9 shows a perspective view of a carrier including a base and at least one elevation disposed over the base.

FIG. 9 shows a perspective view of the carrier 802 shown in FIG. 8A. The carrier 802 shown in FIG. 8A may, for example, be a cross-sectional view of the carrier 802 shown in FIG. 9 along the line A-A'. As shown in FIG. 9, the elevations 802E may, for example, be formed over the base 802F, e.g. at predetermined positions, e.g. to form a matrix of elevations 802E disposed over the base 802F. In other words, adjacent elevations 802E may, for example, be separated from each other by a predetermined distance. As shown in FIG. 9, the side 802Fa of the base 802F may, for example, be disposed between adjacent elevations 802E.

The base 802F of the carrier 802 may, for example, include, or may be, a mold carrier (e.g. a standard flat mold carrier, e.g. standard eWLB flat mold carrier) over which the elevations 802E are formed. The elevations 802E may be formed (e.g. at predetermined positions, e.g. to form a matrix of elevations 802E over the base 802F) by means of at least one of a printing process and a lithographic process, although other processes may be possible as well. The elevations 802E may include, or may consist of, a resist material and/or a resin (e.g. an epoxy resin). The elevations 802E formed over the base 802F of the carrier 802 may subsequently be cured.

By way of another example, the elevations 802E of the carrier 802 disposed over the base of the carrier 802 may be formed by a machining process. For example, the carrier 802 may be machined from an at least substantially flat carrier (e.g. flat mold carrier). For example, a portion of the at least substantially flat carrier (e.g. flat mold carrier) may be removed (e.g. by means of a machining process) and another portion of the at least substantially flat carrier (e.g. flat mold carrier) may remain. The other portion of the at least substantially flat carrier (e.g. flat mold carrier) that may remain may form the elevations 802E (e.g. at predetermined positions, e.g. to form a matrix of elevations 802E over the base 802F).

A height HE and/or a contour (e.g. a slope, a plateau, etc.) of the elevations 802E may be controlled (e.g. during a machining, printing and/or lithographic process). The height HE of the elevations 802E may, for example, be a difference between levels of the side 802Ea of the elevations 802E of the carrier 802 and the side 802Fa of the base 802F of the carrier

802. In relation to the chip arrangements 200 to 600, the height HE of the elevations 802E may at least partially determine the height difference ΔH (e.g. offset) between the first level L1 and the second level L2.

Figure 8B:
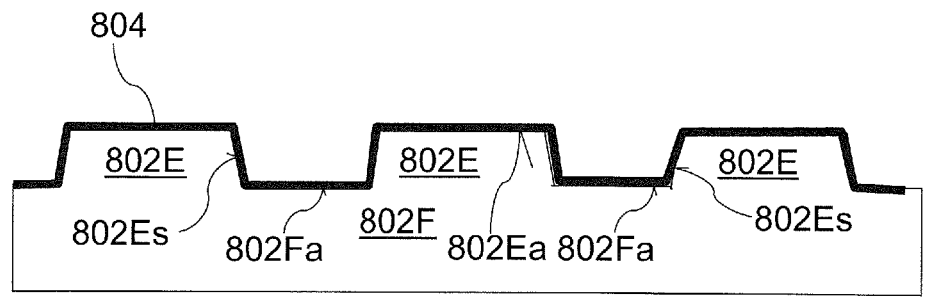

FIG. 8B shows that an adhesive layer 804 (e.g. an adhesive thermal release foil, e.g. a double sided adhesive thermal release foil) may be formed over the carrier 802. The adhesive layer 804 may be formed over the elevations 802E. For example, the adhesive layer 804 may be formed over the at least one sidewall 802Es (e.g. all sidewalls 802Es) of the elevations 802 and over the side 802Ea (e.g. top side) of the elevations 802E. Furthermore, the adhesive layer 804 may be formed over the side 802Fa of the base 802F of the carrier 802. The adhesive layer 804 (e.g. double sided adhesive thermal release foil) may be formed over the carrier 802 by means of a lamination process (e.g. a vacuum lamination process), which may, for example, be a part of a standard fan-out wafer level package process (e.g. eWLB process, e.g. standard eWLB process).

As described above in relation to FIG. 7, the method 700 may include providing a carrier including a base and at least one elevation disposed over the base, the at least one elevation having at least one sidewall and a side facing away from the base (in 702). The carrier disclosed in the method 700 may include, or may be, the carrier 802 shown in FIG. 8B having the adhesive layer 804 (e.g. a double sided adhesive thermal release foil), e.g. formed over the carrier 802. In another example, the carrier disclosed in the method 700 may include, or may be, the carrier 802 shown in FIG. 8A which may be free of the adhesive layer 804. In such an example, the adhesive layer 804 may be disposed on semiconductor chips, which may be subsequently disposed on the carrier 802.

Figure 8C:
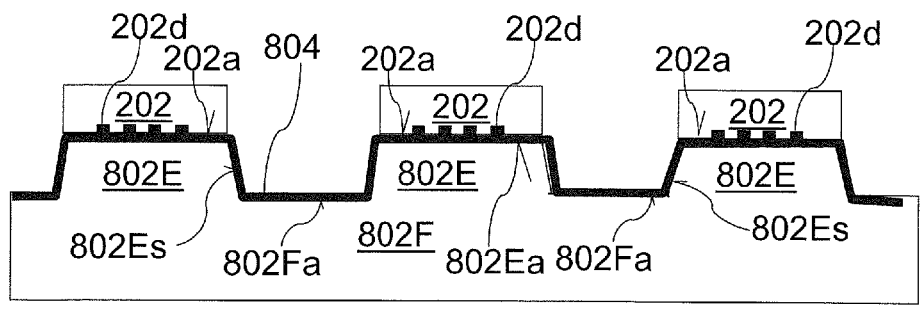

FIG. 8C shows that semiconductor chips 202 may be disposed over (e.g. picked and placed onto) the elevations 802E. For example, a first side 202a of a respective semiconductor chip 202 disposed over a respective elevation 802E may face the side 802Ea of the respective elevation 802E facing away from the base 802F. The adhesive property of the adhesive layer 804 may ensure that the semiconductor chips 202 are securely placed onto the carrier 802 (e.g. attached to the carrier 802).

As described above in relation to FIG. 7, the method 700 may include disposing a semiconductor chip having a first side over the at least one elevation, the first side of the semiconductor chip facing the side of the at least one elevation facing away from the base (in 704). Disposing the semiconductor chip disclosed in FIG. 7 may include, or may be, the process flow shown in FIG. 8C.

The semiconductor chips 202 may include at least one electrically conductive contact 202d disposed at the first side 202a of the semiconductor chips 202. The semiconductor chips 202 may include a metal layer (e.g. a copper layer, e.g. a copper under-bump metallization (UBM) layer) disposed over at least the at least one electrically conductive contact 202d (metal layer not shown in FIG. 8C). The metal layer (e.g. copper layer) may allow for structuring (e.g. laser structuring) of a subsequent layer (e.g. a dielectric layer) that may subsequently be formed at (e.g. on or over) the first side 202a of the semiconductor chips 202.

The semiconductor chips 202 may additionally include a first dielectric layer, which may be disposed at the first side 202a (e.g. active side) of the semiconductor chips 202. The first dielectric layer may, for example, include at least one opening (e.g. at least one via) disposed over the at least one electrically conductive contact 202d of the semiconductor chips 202. The first dielectric layer (not shown in FIG. 8C) may include, or may consist of, a polymer, e. g. polyimide, epoxy or poly-p-phenylene-benzobisoxazole (PBO).

Figure 8D:
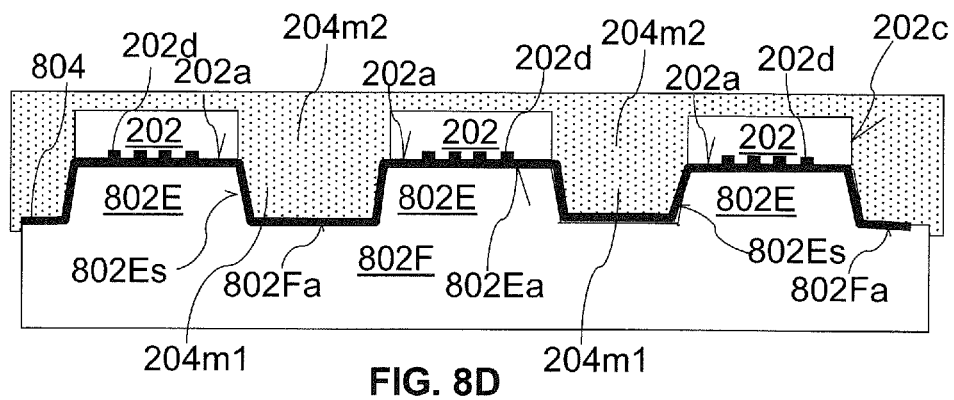

FIG. 8D shows a mold compound 204m1, 204m2, which may at least partially encapsulate the semiconductor chips 202. A portion 204m1 of the mold compound 204m1, 204m2 may at least partially encapsulate (e.g. cover, e.g. completely cover) the at least one sidewall 802Es (e.g. all sidewalls) the elevations 802E. For example, the portion 204m1 of the mold compound 204m1, 204m2 may be disposed laterally adjacent to the elevations 804E. For example, the portion 204m1 of the mold compound 204m1, 204m2 may fill (e.g. completely fill) a space between adjacent elevations 802E. A portion 204m2 of the mold compound 204m1, 204m2 may be disposed laterally adjacent to the semiconductor chips 202 and may cover a side of the semiconductor chips 202 opposite the first side 202a and at least one sidewall 202c (e.g. all sidewalls) of the semiconductor chips 202.

As described above, the method 700 may include at least partially encapsulating the semiconductor chip in a mold compound, the mold compound at least partially encapsulating the at least one sidewall of the at least one elevation (in 706). At least partially encapsulating the semiconductor chip in a mold compound disclosed in FIG. 7 may include, or may be, the process flow shown in FIG. 8D. The semiconductor chips 202 may be at least partially encapsulated in the mold compound 204m1, 204m2 by means of a compression molding process. The mold compound 204m1, 204m2 may be cured (e.g. by means of a curing process) subsequent to the compression molding process.

The process flow shown in FIG. 8A to FIG. 8D may correspond to, or may be, a reconstitution stage of a manufacturing process (e.g. an eWLB manufacturing process). In other words, the process flow shown in FIG. 8A to FIG. 8D may include manufacturing a reconstituted wafer, for example, by means of a fan-out wafer level package manufacturing process (e.g. an eWLB manufacturing process). Stated in yet another way, FIG. 8A to FIG. 8D may show reconstitution, which may refer to the construction of a molded wafer or panel which may include embedded semiconductor chips 202 in the form of an ordered matrix. This molded wafer or panel, which may include an ordered matrix of embedded semiconductor chips 202 may be referred to as a reconstituted wafer.

Figure 8E:
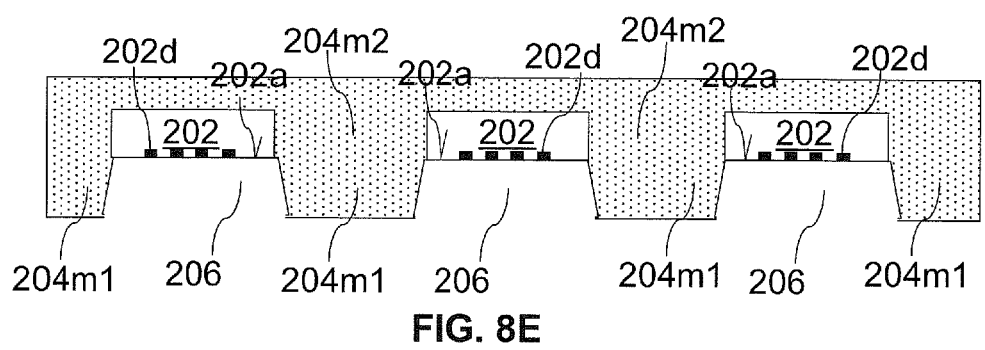

FIG. 8E shows that the carrier 802 may be removed. As shown in FIG. 8E, the portion 204m1 of the mold compound 204m1, 204m2 formerly disposed may be disposed laterally adjacent to a recess 206, which may have at least substantially the same dimensions and contours as the elevation 802E of the carrier 802. In other words, the portion 204m1 of the mold compound 204m1, 204m2 at least partially encapsulating the at least one sidewall 802Es of the elevations 802E may be disposed laterally adjacent to the recess 206. The recess 206 may be arranged at the first side 202a (e.g. below the first side 202a) of the semiconductor chip 202. The adhesive layer 804 (e.g. double sided adhesive thermal release foil) may be removed as well, for example, by means of a heating process. The removed carrier 802 may be re-used or may be cleaned and re-used.

As described above, the method 700 may include removing the carrier to dispose the mold compound laterally adjacent to a recess, the recess arranged at the first side of the semiconductor chip (in 708). Removing the carrier disclosed in FIG. 7 may include, or may be, the process flow shown in FIG. 8E.

Figure 8F:
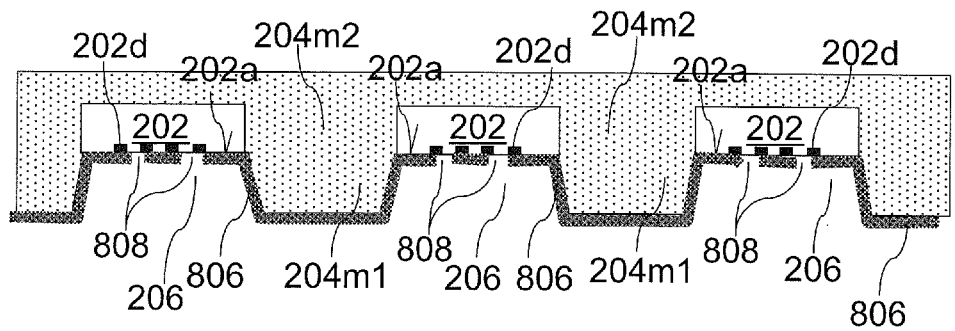

FIG. 8F shows that a dielectric layer 806 may be formed over the first side 202a of the semiconductor chip 202 and the mold compound 204m1, 204m2 (e.g. at least one side (e.g. all sides) of the portion 204m1 of the mold compound 204m1,

204*m*2). The dielectric layer 806 may be formed by means of a lamination process (e.g. a vacuum lamination process), and may subsequently be structured, e.g. by means of a laser (e.g. laser drilling, laser direct imaging) or photolithography (e.g. stepper, mask aligner), at predetermined positions. For example, vias 808 may be formed in the dielectric layer 806 to expose the at least one electrically conductive contact 202*d* of the semiconductor chips 202. Any subsequent electrically conductive layer that may be formed (e.g. over the dielectric layer 806) may be electrically isolated from the semiconductor chips 202 (e.g. due to the dielectric layer 806 being disposed between the electrically conductive layer and the semiconductor chips 202). However, electrical contact with the semiconductor chips 202 may be made through the vias 808 (e.g. laser-structured vias). Forming the vias 808 may include cleaning the vias 808 subsequent to the structuring process (e.g. laser structuring process). A cleaning process used to clean the vias 808 may depend on a diameter (e.g. a caliber) of the vias 808, and may include at least one of a mechanical cleaning process, a chemical cleaning process and a plasma cleaning process. The dielectric layer 806 may be included in, or may be, the insulating layer 204*i*1, 204*i*2 shown in the chip arrangements 200 to 600.

Figure 8G:
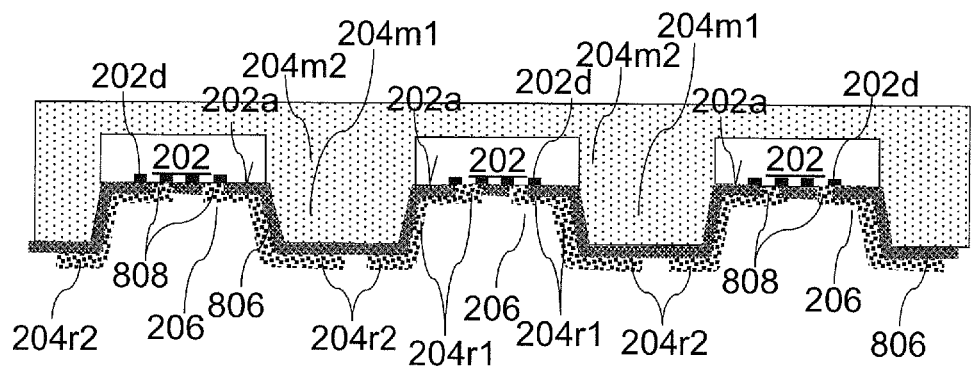

FIG. 8G shows a redistribution structure 204*r*1, 204*r*2 (e.g. a metal layer, e.g. of a pre-determined thickness) formed over the dielectric layer 806. The redistribution structure 204*r*1, 204*r*2 may be formed by means of at least one of thin-film technology (e.g. a sputtering process, a plating process, an electroless chemical deposition process, etc.), seeding, ablation (e.g. laser ablation), and electroless plating. The redistribution structure 204*r*1, 204*r*2 may be structured by means of lithography or a printing process.

For example, a process flow for forming the redistribution structure 204*r*1, 204*r*2 may include forming a seed layer (e.g. by means of a sputtering process). A portion of the seed layer may be subsequently masked (e.g. by means of a lithography process). The masked seed layer may then be plated (e.g. by means of a plating process) to form the redistribution structure 204*r*1, 204*r*2. The mask formed over the seed layer may be subsequently removed, and this may be followed by an etching process (e.g. to remove the portion of the seed layer exposed by the removal of the mask). Portions of the redistribution structure 204*r*1, 204*r*2 which may be thicker (e.g. due to the plating process) may be lightly etched, whilst other portions of the redistribution structure 204*r*1, 204*r*2 which may be thinner (e.g. due to the mask being disposed over these portions during plating) may be removed. A result of this process flow may be the redistribution structure 204*r*1, 204*r*2 which may be present at the surface of the dielectric layer 806, and which may be disposed in the vias 808.

Figure 8H:
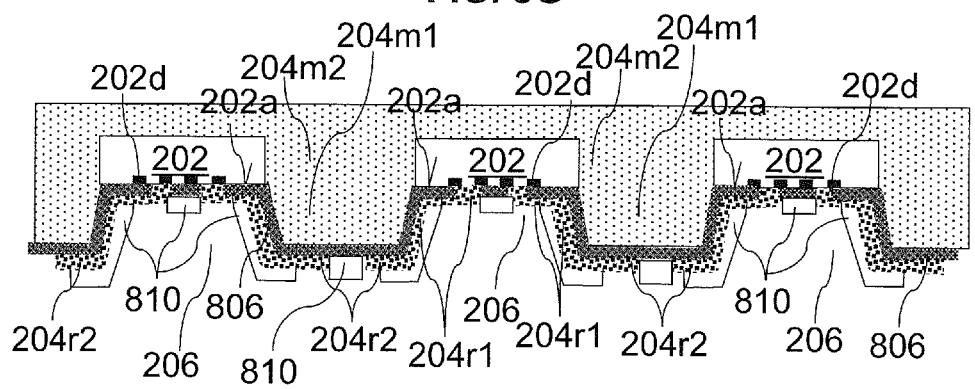

FIG. 8H shows that a solder stop layer 810 may be formed over the redistribution structure 204*r*1, 204*r*2. The solder stop layer 810 may subsequently be structured. The solder stop layer 810 may be applied in the same way as the dielectric layer 806. In another example, a solder stop layer 810 may be applied in a different way and may depend of costs, manufacturing or quality specifications. Dimensions of the solder stop layer 810 may be greater than those of the dielectric layer 806. Accordingly, structuring the solder stop layer 810 may not be limited to a laser structuring process. Other options to structure the solder stop layer 810 may include chemical etching, or reactive ion etching (RIE) plasma etching. The structuring of the solder stop layer 810 may leave regions of the redistribution structure 204*r*1, 204*r*2 exposed (e.g. at a fixed dimension (pitch)). These exposed regions of the redistribution structure 204*r*1, 204*r*2 may subsequently have at least one electrical connector or an electronic device attached to them. Conversely, regions of the redistribution structure 204*r*1, 204*r*2 which may be covered by the solder stop layer 810 may be protection by the solder stop layer 810.

The process flow shown in FIG. 8E to FIG. 8H may correspond to, or may be, a redistribution stage of a manufacturing process (e.g. an eWLB manufacturing process). In other words, the process flow shown in FIG. 8E to FIG. 8H may include redistribution, which may include an addition of subsequent layers to the mold compound 204*m*1, 204*m*2, where the subsequent layers may include a dielectric layer 806, a redistribution structure 204*r*1, 204*r*2, and a solder stop layer 810. The subsequent layers may facilitate a network of electrical connections that may be formed on the semiconductor chip 202 and the mold compound 204*m*1, 204*m*2.

Following redistribution may be a process known as ball apply. In the ball apply stage of a manufacturing process (e.g. an eWLB manufacturing process), the connection from the reconstituted wafer (e.g. from metal pads on the reconstituted wafer) may be attached to at least one electrical connector (e.g. solder ball), which may subsequently be connected to a circuit board (e.g. a printed circuit board).

Figure 8I:
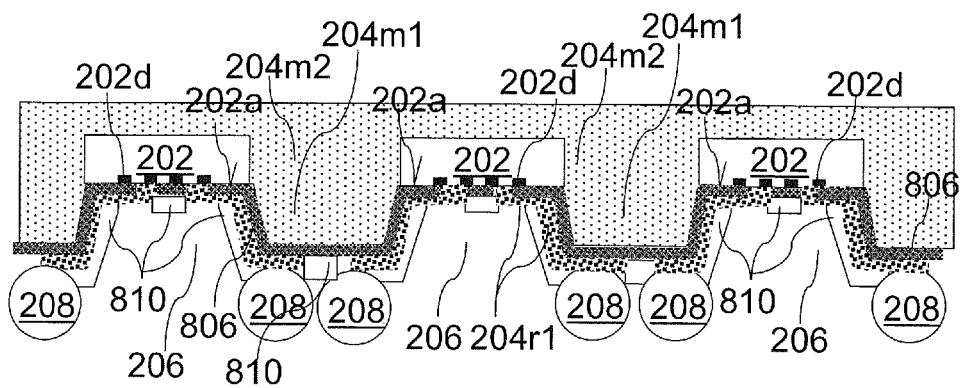

FIG. 8I shows the application of at least one electrical connector 208 (e.g. solder ball) to the reconstituted wafer. The solder ball application process may employ a flux mask and a ball mask. For example, a flux may be applied first through the flux mask with fixed dimensions, e.g. to limit the amount of flux on the semiconductor chips 202. This may be followed by the ball mask, which may be needed to place the at least one electrical connector 208 (e.g. solder ball) at correct positions on the reconstituted wafer and exclude other areas. During this process, the at least one electrical connector 208 (e.g. solder ball) may be swept over the ball mask and subsequently dropped in the flux, e.g. on metal pads provided on the reconstituted wafer.

Figure 8J:
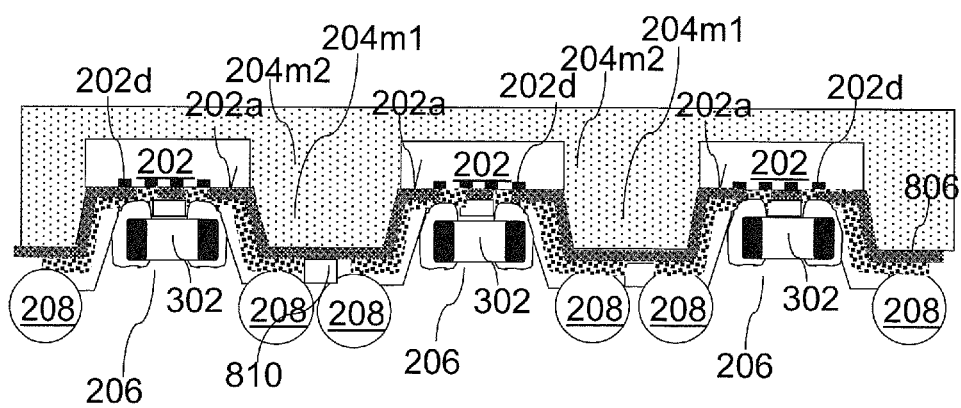

FIG. 8J shows electronic devices 302 disposed at least partially within the recess 206. The electronic devices 302 can be disposed over the semiconductor chips 202 and in the recess 206. As described above, a size of the recess 206 may be varied to facilitate different dimensions of the electronic devices 302.

The electronic devices 302 may be placed on the package with a mechanical pick and place machine. Following this, the reconstituted wafer may be subjected to a temperature profile, e.g. in a solder reflow oven. During this process, the at least one electrical connector 208 (e.g. solder ball) and the electronic devices 302 may be fixed into position.

Figure 8K:
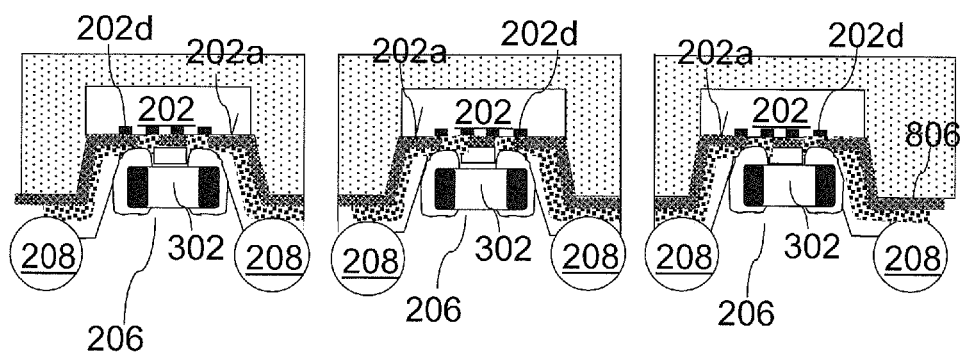

FIG. 8K shows a singulation (i.e. separation) of individual semiconductor chips 202 from the reconstituted wafer. Each singulated or separated semiconductor chip 202 may correspond to, or may be, at least one of the chip arrangements 200 to 400. Singulation may be carried out by means of a dicing process (e.g. a laser dicing process), for example, by means of a dicing tool.

As described above in relation to the chip arrangement 600, at least one second electrical connector 602 may be disposed at least partially within the recess 206. In a method for manufacturing such a chip arrangement, the previously described process flow for reconstitution and redistribution may remain as described above. However, the ball apply stage of the manufacturing process (e.g. an eWLB manufacturing process) may be adapted.

The adapted ball apply stage may require a use of more than one mask, e.g. in order to allow the positioning of electrical connectors (e.g. solder balls) of different sizes on the reconstituted wafer.

In an example, a solder mask for the smaller sized connectors (e.g. the at least one electrical connector 208) may be applied first. The solder mask for the smaller connectors (e.g. the at least one electrical connector 208) may have openings over metal pads provided on the reconstituted wafer, and outside the recess 206. A solder mask for the larger sized connectors (e.g. the at least one second electrical connector 602) may be applied. The at least one second electrical connector 602 may be placed into the recess 206. If the number of electrical connectors 208 and 602 to be placed are not significant in number, then the operation could be completed using a single placer instead of a multi mask solution.

In another example, the ball apply stage may use a stencil having different thicknesses. The stencil may be thick and may have larger openings in a center area (e.g. corresponding to a region of the recess 206) than on the edge (e.g. corresponding to a region outside the recess 206). The larger sized connectors (e.g. the at least one second electrical connector 602) may be applied first. After having filled the deeper and/or broad holes, the smaller connectors (e.g. the at least one electrical connector 208, e.g. pre-formed solder balls) may be printed into the smaller openings. Both the larger and smaller sized connectors (e.g. solder balls) may then be commonly reflowed.

It may be possible to use a single ball placer for one of the electrical connects (e.g. the larger or smaller sized connectors) or to use two stencils, possibly with two reflow processes for the ball apply stage. An effect provided by the provision of different sizes electrical connectors within the recess 206 and planar area outside the recess 206 may be increased reliability or electrical performance of the final package.

As described above in relation to the chip arrangement 500, a second semiconductor chip 502 may be disposed at least partially within the recess 206. In a method for manufacturing such a chip arrangement, the previously described process flow for reconstitution and redistribution may remain as described above. However, the ball apply stage of the manufacturing process (e.g. an eWLB manufacturing process) may be adapted such that the second semiconductor chip 502 replaces the at least one second electrical connector 602 in the recess 206.

The method for manufacturing a chip arrangement including the second semiconductor chip 502 may support more complex multi-chip devices. For example, a height and/or depth of the recess 206 may be varied to further accommodate an electronic device 302 or other components (e.g. other dies, e.g. MEMS dies) of various form factors.

According to various examples described herein, an electronic component (e.g. an SMD component, e.g. passive SMD component) may be placed in face-to-face configuration on a chip package.

According to various examples described herein, an eWLB manufacturing technique may be used to manufacture a chip arrangement instead of a laminate manufacturing technique.

According to various examples described herein, a semiconductor chip may be recessed in an encapsulating structure (e.g. a mold compound) of, for example, an eWLB package, in order to generate a first gap between a circuit board (e.g. a customer board) and the semiconductor chip (and possibly a portion of the mold compound). The first gap may be larger (e.g. wider) than a second gap between the circuit board and the rest of the encapsulating structure. The second gap may allow a connection of at least one electrical connector (e.g. one or more solder balls) for electrical connection of the semiconductor die to the circuit board (e.g. printed circuit board). The first gap (e.g. the wider/larger gap) may allow the placement of at least one electronic component (e.g. a SMD component, e.g. a passive SMD component) and/or another semiconductor chip and/or at least one second electrical connector with greater thickness than the at least one electrical connector (e.g. one or more solder balls).

According to various examples presented herein, a chip arrangement may be provided. The chip arrangement may include: a semiconductor chip; an encapsulating structure at least partially encapsulating the semiconductor chip, the encapsulating structure having a first side and a second side opposite the first side, the encapsulating structure including a recess over the first side of the encapsulating structure, the recess may have a bottom surface located at a first level; and at least one electrical connector disposed at the first side of the encapsulating structure outside the recess, wherein a surface of the at least one electrical connector facing the encapsulating structure is disposed at a second level different from the first level.

The second level may be located at a distance farther from the second side of the encapsulating structure than the first level.

The semiconductor chip may be arranged over the recess.

An active side of the semiconductor chip may face the recess.

A lateral extent of the semiconductor chip may be greater than or equal to a lateral extent of the bottom surface of the recess.

A lateral extent of the semiconductor chip may be less than or equal to a lateral extent of the bottom surface of the recess.

The encapsulating structure may include a mold compound at least partially encapsulating the semiconductor chip.

A portion of the mold compound may be disposed laterally adjacent to the recess.

The encapsulating structure may include a redistribution structure disposed at least at the bottom surface of the recess.

A first portion of the redistribution structure may be disposed at the bottom surface of the recess and a second portion of the redistribution structure may be disposed outside the recess.

The redistribution structure may be electrically coupled to the semiconductor chip.

The encapsulating structure may include an insulating layer disposed at least at the bottom surface of the recess.

A first portion of the insulating layer may be disposed at the bottom surface of the recess and a second portion of the insulating layer may be disposed outside the recess.

A portion of the insulating layer may be disposed laterally adjacent to the recess.

The insulating layer may include at least one of a dielectric layer and a solder stop layer.

The chip arrangement may further include an electronic device disposed at least partially within the recess.

An active side of the electronic device may face the bottom surface of the recess.

The electronic device may be electrically coupled to the semiconductor chip.

The electronic device may include, or may be, a surface-mount device.

A thickness of the electronic device may be greater than a height of the at least one electrical connector.

The chip arrangement may further include a circuit board in contact with the at least one electrical connector; and a gap disposed between a surface of the electronic device facing the circuit board and a surface of the circuit board facing the electronic device.

The chip arrangement may further include a second semiconductor chip disposed at least partially within the recess.

The second semiconductor chip may include, or may be, at least one of a microelectromechanical systems device, an application-specific integrated circuit, an active device, and a passive device.

The semiconductor chip and the second semiconductor chip may be configured as a mother die and a daughter die, respectively.

The chip arrangement may further include at least one second electrical connector disposed at least partially within the recess.

A height of the at least one second electrical connector disposed at least partially within the recess may be greater than a height of the at least one second electrical connector disposed at the first side of the encapsulating structure outside the recess.

The at least one electrical connector may be electrically coupled to the semiconductor chip.

The at least one electrical connector may include, or may be, at least one solder ball.

The chip arrangement may be configured as a chip package.

The chip arrangement may be configured as an embedded wafer level ball grid array package.

According to various examples presented herein, a chip arrangement may be provided. The chip arrangement may include: a semiconductor chip; a mold compound at least partially encapsulating the semiconductor chip, the mold compound having a first side and a second side opposite the first side, the mold compound at least partially encapsulating a recess over the first side of the mold compound, the recess may have a bottom surface located at a first level, the mold compound including an at least substantially planar side disposed at a second level different from the first level and disposed outside the recess.

The second level may be located at a distance farther from the second side of the mold compound than the first level.

The chip arrangement may further include an electronic device disposed at least partially within the recess.

The chip arrangement may further include at least one electrical connector disposed at the at least substantially planar region of the mold compound.

According to various examples presented herein, a method for manufacturing a chip arrangement may be provided. The method may include: providing a carrier including a base and at least one elevation disposed over the base, the at least one elevation having at least one sidewall and a side facing away from the base; disposing a semiconductor chip having a first side over the at least one elevation, the first side of the semiconductor chip facing the side of the at least one elevation facing away from the base; at least partially encapsulating the semiconductor chip in a mold compound, the mold compound at least partially encapsulating the at least one sidewall of the at least one elevation; and removing the carrier to dispose the mold compound laterally adjacent to a recess, the recess arranged at the first side of the semiconductor chip.

At least partially encapsulating the semiconductor chip in the mold compound may include a compression molding process.

Providing the carrier including the base and the at least one elevation may include forming the at least one elevation at a first side of the carrier.

Forming the at least one elevation at the first side of the carrier may include at least one of a machining process, a printing process and a lithographic process.

Various examples and aspects described in the context of one of the chip arrangements or chip packages or methods described herein may be analogously valid for the other chip arrangements or chip packages or methods described herein.

While various aspects have been particularly shown and described with reference to these aspects of this disclosure, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A chip arrangement, comprising:
   a semiconductor chip;
   an encapsulating structure completely encapsulating the semiconductor chip, the encapsulating structure having a first side and a second side opposite the first side,
   the encapsulating structure comprising a recess over the first side of the encapsulating structure, the recess having a bottom surface located at a first level and at least one side wall;
   a redistribution structure extending across the bottom surface of the recess and over the at least one side wall, wherein a portion of the redistribution structure extends outside the recess;
   at least one electronic device fixed to the bottom surface of the recess and electrically coupled to the redistribution structure,
   wherein the at least one electronic device is at least partially contained in the recess;
   and wherein an active side of the electronic device faces the bottom surface of the recess; and
   at least one electrical connector disposed at the first side of the encapsulating structure outside the recess, wherein a surface of the at least one electrical connector facing the encapsulating structure is disposed at a second level different from the first level.

2. The chip arrangement of claim 1, wherein the second level is located at a distance farther from the second side of the encapsulating structure than the first level.

3. The chip arrangement of claim 1, wherein the semiconductor chip is arranged over the recess.

4. The chip arrangement of claim 1, wherein an active side of the semiconductor chip faces the recess.

5. The chip arrangement of claim 1, wherein the encapsulating structure comprises:
   a mold compound.

6. The chip arrangement of claim 5, wherein a portion of the mold compound is disposed laterally adjacent to the recess.

7. The chip arrangement of claim 1, wherein the encapsulating structure comprises:
   an insulating layer disposed at least at the bottom surface of the recess.

8. The chip arrangement of claim 7, wherein a first portion of the insulating layer is disposed at the bottom surface of the recess and a second portion of the insulating layer is disposed outside the recess.

9. The chip arrangement of claim 7, wherein the insulating layer comprises at least one of a dielectric layer and a solder stop layer.

10. The chip arrangement of claim 1, wherein the electronic device comprises a surface-mount device.

11. The chip arrangement of claim 1, wherein a thickness of the electronic device is greater than a height of the at least one electrical connector.

12. The chip arrangement of claim 1, further comprising:
a second semiconductor chip disposed at least partially within the recess.

13. The chip arrangement of claim 1, further comprising:
at least one second electrical connector disposed at least partially within the recess.

14. The chip arrangement of claim 13, wherein a height of the at least one second electrical connector disposed at least partially within the recess is greater than a height of the at least one first electrical connector disposed at the first side of the encapsulating structure outside the recess.

15. The chip arrangement of claim 1, configured as an embedded wafer level ball grid array package.

16. A chip arrangement, comprising:
a semiconductor chip;
a mold compound completely encapsulating the semiconductor chip,
the mold compound having a first side and a second side opposite the first side; and
the mold compound at least partially encapsulating a recess over the first side of the mold compound, the recess having a bottom surface located at a first level, the mold compound comprising an at least substantially planar side disposed at a second level different from the first level and disposed outside the recess;
a conductive layer formed over the bottom surface of the recess and extending out of the recess to at least partially extend over the substantially planar side; and
an electronic device disposed at least partially within the recess,
wherein an active side of the electronic device faces the bottom surface of the recess; and
wherein the active side of the electronic device is electrically coupled to the conductive layer.

17. The chip arrangement of claim 16, wherein the second level is located at a distance farther from the second side of the mold compound than the first level.

* * * * *